United States Patent
Nozuyama

(10) Patent No.: US 7,966,138 B2
(45) Date of Patent: Jun. 21, 2011

(54) APPARATUS FOR CREATING TEST PATTERN AND CALCULATING FAULT COVERAGE OR THE LIKE AND METHOD FOR CREATING TEST PATTERN AND CALCULATING FAULT COVERAGE OR THE LIKE

(75) Inventor: Yasuyuki Nozuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 558 days.

(21) Appl. No.: 12/107,324

(22) Filed: Apr. 22, 2008

(65) Prior Publication Data
US 2008/0262761 A1    Oct. 23, 2008

(30) Foreign Application Priority Data

Apr. 23, 2007    (JP) .................................. 2007-112914

(51) Int. Cl.
*G01R 31/28* (2006.01)
(52) U.S. Cl. .......................................................... 702/59
(58) Field of Classification Search ...................... 702/59
See application file for complete search history.

(56) References Cited

U.S. PATENT DOCUMENTS

| | | |
|---|---|---|
| 2006/0005094 A1 | 1/2006 | Nozuyama |
| 2007/0201618 A1 | 8/2007 | Nozuyama |
| 2007/0260408 A1 | 11/2007 | Nozuyama |

FOREIGN PATENT DOCUMENTS

JP    2003-107138    4/2003

OTHER PUBLICATIONS

Nozuyama, et al., A Method for Estimating and Enhancing Test Quality Using Layout Information—A basic method and a few examples (bridge fault Iddq test, weighted stuck-at fault coverage), Technical Report of IEICE (Japan), vol. CPM2002-152, pp. 1-6, Jan. 2003.
C.E. Stroud, et al., Bridging Fault Extraction from Physical Design Data for Manufacturing Test Development, Proc. IEEE International Test Conference, pp. 760-769, Oct. 2000.
V.R. Sar-Dessai, et al., Resistive Bridge Fault Modeling, Simulation and Test Generation, Proc. IEEE International Test Conference, pp. 596-605, 1999.
S. Sengupta, et al., Defect-Based Test: A Key Enabler for Successful Migration to Structural Test, Intel Technology Journal, pp. 1-14, Q1'99.

(Continued)

*Primary Examiner* — Tung S Lau
(74) *Attorney, Agent, or Firm* — Turocy & Watson, LLP

(57) ABSTRACT

The method for creating a test pattern and calculating a fault coverage or the like of the present invention is characterized by creating bridging fault voltage information indicating a voltage of a bridging assumed on the wire derived from an output terminal of a cell, calculating a logical threshold of an input terminal of the cell, extracting bridging fault information on an adjacent wire pair, calculating a detection limit resistance value using the logical threshold, adding the detection limit resistance value to bridging fault voltage information, creating extended bridging fault voltage information, creating a bridging fault list including a bridging fault type based on the extended bridging fault voltage information, creating a test pattern based on the bridging fault list, judging whether or not a bridging fault can be detected through this test pattern, creating fault detection information and calculating a weighted fault coverage based on the fault detection information and bridging fault generation information.

20 Claims, 20 Drawing Sheets

OTHER PUBLICATIONS

M. Renovell, et al., The Concept of Resistance Interval: A New Parametric Model for Realistic Resistive bridging Fault, Proc. 13th VLSI Test Symposium, pp. 184-189, 1995.

P. Engelke, et al., Simulating Resistive Bridging and Stuck-At Faults, Proc. International Test Conference, pp. 1051-1059, 2003.

I. Polian, et al., Modeling Feedback Bridging Faults with Non-Zero Resistance, Europian Test Workshop, 4A-3, 2003.

<BASIC CELL A NAME, OUTPUT TERMINAL NAME>(<INPUT TERMINAL NAME>,...<BASIC CELL B NAME, OUTPUT TERMINAL NAME> (<INPUT TERMINAL NAME>,...) :
/O1(<INPUT OF A WHICH BECOMES 0>)(<INPUT OF B WHICH BECOMES 1 > ) < BRIDGING FAULT VOLTAGE>
( < DC CURRENT VALUE>)< FREQUENCY OF INPUT>,

...

/10(<INPUT OF A WHICH BECOMES 1>)(<INPUT OF B WHICH BECOMES 0>)<BRIDGING FAULT VOLTAGE>(<DC CURRENT VALUE>)< FREQUENCY OF INPUT> ,

AND2.Z(A,B) NOR3.Z(A,B,C):
/01  (0,0)(0,0,0)  0.681 635u 1,
/10  (1,1)(1,0,0)  0.807 328u 3,
/10  (1,1)(1,1,0)  0.759 459u 3,
/10  (1,1)(1,1,1)  0.693 592u 1,

ZA=ZB=Z (BECAUSE OF R=0)

OUTPUT  FREQUENCY
  Z=0    1    (A,B,C)=(1,1,1)

Z=1    3    (A,B,C)=(1,0,0),(0,1,0),(0,0,1)    GROUP 1
         3    (A,B,C)=(0,1,1),(1,0,1),(1,1,0)    GROUP 2
         1    (A,B,C)=(0,0,0)                    GROUP 3

<BASIC CELL A NAME> <INPUT TERMINAL NAME> <LOGICAL THRESHOLD>

$V_0 = VDD/2$ $V_I = 0.1$ V ARE SET,

DISTRIBUTION OF THRESHOLDS (TOTAL) OR THRESHOLD DISTRIBUTION FOR EACH NET

RcX(V) : DETECTION LIMIT RESISTANCE VALUE CORRESPONDING TO VOLTAGE V OF SIGNAL X

RcB(V) MONOTONOUSLY DECREASES TOGETHER WITH V (a) CASE OF /10 (SIGNAL A=1, B=0)

WHEN VDD/2+0.1 V<VBR (INPUT, 0)　　(,RcB(VDD/2+0.1V)RcB(VDD/2)RcB(VDD/2-0.1V) )
WHEN VDD/2<Vbr (INPUT, 0)<VDD/2+0.1 V　(,RcA(VDD/2+0.1V),RcB(VDD/2)RcB(VDD/2-0.1V)
WHEN VDD/2-0.1 V<Vbr (INPUT, 0)<VDD/2　(,RcA(VDD/2+0.1V)RcA(VDD/2),RcB(VDD/2-0.1V)
WHEN Vbr (INPUT, 0)<VDD/2-0.1 V　　(,RcA(VDD/2+0.1V)RcA(VDD/2)RcA(VDD/2-0.1V),)

<A SIGNAL DRIVE BASIC CELL NAME>.<OUTPUT TERMINAL NAME>:<B SIGNAL DRIVE BASIC CELL NAME>.<OUTPUT TERMINAL NAME>:(INPUT TERMINAL CONFIGURATION)<B SIGNAL DRIVE BASIC CELL NAME>.<OUTPUT TERMINAL NAME>.<OUTPUT TERMINAL NAME>:(INPUT TERMINAL CONFIGURATION):
/01(INPUT CONFIGURATION IN WHICH A SIGNAL =0)(INPUT CONFIGURATION IN WHICH B SIGNAL =1)<OUTPUT VOLTAGE WHEN R=0><DC CURRENT VALUE WHEN R=0><RESISTANCE VALUE Rc WHEN Vbr=V0-V1><RESISTANCE VALUE Rc WHEN Vbr=V0><RESISTANCE VALUE Rc WHEN Vbr=V0+V1 > ) <DC CURRENT VALUE WHEN Vbr=V0>(<RELATIVE PROBABILITY OF OCCURRENCE> (<BRIDGING FAULT TYPE (WITH RESPECT TO V0 WHEN R=0)>),

. . .

/10(INPUT CONFIGURATION IN WHICH A SIGNAL =1)(INPUT CONFIGURATION IN WHICH B SIGNAL =0)<OUTPUT VOLTAGE WHEN R=0><DC CURRENT VALUE WHEN R=0>(<RESISTANCE VALUE Rc WHEN Vbr=V0-V1><RESISTANCE VALUE Rc WHEN Vbr=V0><RESISTANCE VALUE Rc WHEN Vbr=V0+V1>)<DC CURRENT VALUE Vbr=V0 > < RELATIVE PROBABILITY OF OCCURRENCE>(<BRIDGING FAULT TYPE (WITH RESPECT TO V0) WHEN R=0>),

| SIGNAL A | SIGNAL B | FAULT TYPE | | | |
|---|---|---|---|---|---|
| | | WIRED AND | WIRED OR | A DOMINATE | B DOMINATE |
| 0 | 0 | 0 | 0 | 0 | 0 |
| 0 | 1 | 0 | 1 | 0 | 1 |
| 1 | 0 | 0 | 1 | 1 | 0 |
| 1 | 1 | 1 | 1 | 1 | 1 |

AN2.Z(A B) NR3.Z(A B C):
/01 (0,0)(0,0,0)  0.319 299u (1799 1679 1540,) 0.134m 1.00(F0) ,
/10 (1,1)(1,0,0)  0.895 173u (2037 1820 1683,) 0.115m 0.43(F1) ,
/10 (1,1)(1,1,0)  0.726 185u (1082 893 340,) 0.109m 0.43(F1) ,
/10 (1,1)(1,1,1)  0.655 211u (549 123, 98) 0.153m 0.14(F1/S0) ,

```
<SIGNAL A> <SIGNAL B><ADJACENT WIRING LENGTH> :
<DRIVE INSTANCE NAME OF SIGNAL A > ( <BASIC CELL NAME>).(<DRIVE TERMINAL NAME OF SIGNAL A>,<ENABLE
TERMINAL NAME> | <INPUT TERMINAL NAME>;
- < DRIVE INSTANCE NAME OF SIGNAL A > ( < BASIC CELL NAME>,<CONNECTING INPUT TERMINAL NAME OF SIGNAL A>
                                                                         ...)

< DRIVE INSTANCE NAME OF SIGNAL B > ( < BASIC CELL NAME>).
(<DRIVE TERMINAL NAME OF SIGNAL B>,<ENABLE TERMINAL NAME> | <INPUT TERMINAL NAME>;...)
- < DRIVE INSTANCE NAME OF SIGNAL B > ( < BASIC CELL NAME>).<CONNECTING INPUT TERMINAL NAME OF SIGNAL B>
   .             .
```

FIG. 13

<SIGNAL A><SIGNAL B><ADJACENT WIRING LENGTH>:
  <A SIGNAL DRIVE BASIC CELL INSTANCE NAME><BASIC CELL NAME>.<OUTPUT TERMINAL NAME>.<INPUT TERMINAL CONFIGURATION)<B SIGNAL DRIVE BASIC CELL INSTANCE NAME><BASIC CELL NAME>.<OUTPUT TERMINAL NAME>(INPUT TERMINAL CONFIGURATION):

-<BRIDGE FAULT TYPE>(<A SIGNAL DRIVE CELL INPUT VALUE>)(<B SIGNAL DRIVE CELL INPUT VALUE>)(<Rc(V0-V1)>, Rc(V0), Rc(V0+V1) >) <TOTAL DETECTION ACCURACY> (< RELATIVE PROBABILITY OF OCCURRENCE >
< PROPAGATION PROBABILITY>) < DETECTION INFORMATION > ,

<BRIDGING FAULT TYPE><SIGNAL A>(<A SIGNAL DRIVE CELL INPUT VALUE>)<SIGNAL B>
(<B SIGNAL DRIVE CELL INPUT VALUE >) < DETECTION INFORMATION > ;

FIG. 15

<BASIC CELL A NAME. OUTPUT TERMINAL NAME>(<INPUT TERMINAL NAME>,...)
<BASIC CELL B NAME, OUTPUT TERMINAL NAME> (<INPUT TERMINAL NAME>,...) :
/01(<INPUT OF A WHICH BECOMES 0>)(<INPUT OF B WHICH BECOMES 1 > ) < SHORT
VOLTAGE> ( < DC CURRENT VALUE>)<FREQUENCY OF INPUT><SIGNAL No FOR
DOING INPUT TO FEEDBACK LOOP WHEN OSCILLATION/HOLDING FAULT OCCURS>
<BASIC OSCILLATION/HOLDING FAULT OCCURRENCE ACCURACY> <TYPE OF
SPECIAL FAULT>.

/10(<INPUT OF A WHICH BECOMES 1>)(<INPUT OF B WHICH BECOMES0>)<SHORT
VOLTAGE>( < DC CURRENT VALUE>)<FREQUENCY OF INPUT><SIGNAL No FOR
DOING INPUT TO FEEDBACK LOOP WHEN OSCILLATION/HOLDING FAULT OCCURS>
<BASIC OSCILLATION/HOLDING FAULT OCCURRENCE ACCURACY> <TYPE OF
SPECIAL FAULT>,

/01_SFB(<INPUT OF A WHICH BECOMES 0>)(<INPUT OF B WHICH BECOMES 1 >)
<SHORT VOLTAGE> ( < DC CURRENT VALUE>)<FREQUENCY OF INPUT><SIGNAL
No FOR DOING INPUT TO SELF FEEDBACK><SPECIAL FAULT OCCURRENCE
ACCURACY> <TYPE OF SPECIAL FAULT>,

/10_SFB(<INPUT OF A WHICH BECOMES 1>)(<INPUT OF B WHICH BECOMES 0>)
<SHORT VOLTAGE> ( < DC CURRENT VALUE>)<FREQUENCY OF INPUT><SIGNAL
No FOR DOING INPUT TO SELF FEEDBACK > < SPECIAL FAULT OCCURRENCE
ACCURACY> <TYPE OF SPECIAL FAULT>,

FIG. 21

<SIGNAL A><S'IGNAL B><SIGNAL No FOR DOING INPUT TO FEEDBACK LOOP>
<WHETHER NUMBER OF SIGNAL INVERSIONS INCLUDED IN FEEDBACK LOOP
IS EVEN OR ODD>(<NUMBER OF SIGNAL INVERSIONS INCLUDED IN FEEDBACK
LOOP>)<NUMBER OF LOGICAL GATES INCLUDED IN FEEDBACK LOOP>;

FIG. 22

<SIGNAL A><SIGNAL B><ADJACENT WIRING LENGTH> :
<A SIGNAL DRIVE BASIC CELL INSTANCE NAME><BASIC CELL NAM E > .
< OUTPUT TERMINAL NAM E > (INPUT TERMINAL CONFIGURATION)
<B SIGNAL DRIVE BASIC CELL INSTANCE NAME><BASIC CELL NAME>.
<OUTPUT TERMINAL NAME>(INPUT TERMINAL CONFIGURATION) :
-<BRIDGING FAULT TYPE/SPECIAL FAULT TYPE>(<A SIGNAL DRIVE CELL
INPUT VALUE>)(<B SIGNAL DRIVE CELL INPUT VALUE>)<SIGNAL No
FOR DOING INPUT TO FEEDBACK LOOP><TOTAL DETECTION
ACCURACY>(<RELATIVE PROBABILITY OF OCCURRENCE >
< PROBABILITY OF OCCURRENCE OF PROPAGATION/OSCILLATION/
HOLDING FAULT OR THE LIKE > ) < DETECTION IN FORMATION > ,

<BRIDGING FAULT TYPE/SPECIAL FAULT TYPE><SIGNAL No DOING
INPUT TO FEEDBACK LOOP><SIGNAL A>(<A SIGNAL DRIVE CELL
INPUT VALUE>)<SIGNAL B>(<B SIGNAL DRIVE CELL INPUT
VALUE > ) < DETECTION IN FORMATION > ;

FIG. 25

APPARATUS FOR CREATING TEST PATTERN AND CALCULATING FAULT COVERAGE OR THE LIKE AND METHOD FOR CREATING TEST PATTERN AND CALCULATING FAULT COVERAGE OR THE LIKE

CROSS REFERENCE TO RELATED APPLICATION

This application is based upon and claims benefit of priority from the Japanese Patent Application No. 2007-112914, filed on Apr. 23, 2007, the entire contents of which are incorporated herein by reference.

BACKGROUND OF THE INVENTION

The present invention relates to an apparatus for creating test pattern and calculating a fault coverage or the like and a method for creating a test pattern and calculating a fault coverage or the like.

RELATED ART

With the advance of miniaturization in semiconductor processes and multilayered wiring, the proportion of bridging faults among faults of semiconductor integrated circuits (LSI) is estimated to increase. A bridging fault occurs when foreign matters such as dust are stuck across a pair of signal wires arranged close to each other (hereinafter referred to as a "wire pair") resulting in a short circuit between the wires.

Conventionally, bridging fault detection tests targeted at bridging faults have been put to practical use centered on IDDQ tests which are easy to realize. An IDDQ test detects a bridging fault by measuring a DC current (IDDQ) and observing an abnormal IDDQ which flows when a signal propagating through one wire in which the bridging fault has occurred is "1" and a signal propagating through the other wire is "0", and vice versa.

However, with the advance of process miniaturization, an IDDQ value drastically increases with an LSI operating at high speed in particular, making it difficult to apply an IDDQ to detect to detect an abnormal IDDQ from the measured IDDQ thereto.

For this reason, a test for detecting a bridging fault by inputting a bridging fault detection pattern instead of an abnormal IDDQ value to the LSI, making a comparison between the logical value and expected value of the output terminal and making a pass/fail decision (hereinafter referred to as "logical bridging fault detection test") is becoming extremely important as a bridging fault detection test applicable to the LSI (e.g., see Japanese Patent Laid-Open No. 2003-107138).

However, logical bridging fault detection tests applicable to large-scale LSIs cannot yet be said to have fully improved except simple ones that only handle bridging fault types such as Wired-AND or Wired-OR.

In general, when logical values of signals propagating through a wire pair where a bridging fault has occurred are different from each other, the bridging fault is activated and the bridging fault is propagated and detected.

"Propagation of a bridging fault" refers to propagation of an error signal different from a normal signal generated under the influence of the bridging fault through an LSI. When the error signal propagates through the LSI and reaches an output terminal of the LSI, the bridging fault which causes the error signal can be detected.

Generally, a test pattern for detecting a bridging fault is generated by an automatic test pattern generation (ATPG) tool for detecting a bridging fault based on logical connection net information of the LSI. The bridging fault extracted from layout information of the LSI is associated with a signal on an LSI logical connection net.

However, the accuracy of a bridging fault detection test is influenced by various factors such as what type of behavior the bridging fault has or at what degree of accuracy a bridging fault judged to have been detected by a test pattern is actually detected.

Examples of such factors may include a drive element that drives two signal lines which have caused a short circuit fault, value inputted to this drive element, value of resistance between short-circuited wires, reception cell that receives each signal and logical threshold of an input terminal of this reception cell. Therefore, it is important to model these factors with high accuracy.

On the other hand, as the fault detection accuracy of a test pattern for a bridging fault detection test, only a certain practical level of accuracy needs to be achieved and even if the accuracy is further improved, the additional effect of the bridging fault detection test tends to reduce. Therefore, it is necessary to enable a test pattern to be created which takes a short time to create a recent large-scale LSI and has practical accuracy.

A bridging fault test having high fault detection accuracy can accurately model (reproduce) a bridging fault which is an assumed bridging fault occurring in the actual LSI. Furthermore, a bridging fault judged to have been detected by the test pattern created can actually be propagated through the LSI and detected with high accuracy.

Whether or not the bridging fault is propagated through the LSI is determined as described above by a drive circuit that outputs a signal to the wire pair in which the bridging fault has occurred, input to the drive circuit, value of resistance between wires of the wire pair, reception circuit to which an error signal propagating through the wire is inputted and logical threshold of the input terminal to which the error signal is inputted.

However, it is extremely difficult to acquire all the above described information and acquisition of information takes an enormous amount of time for a large-scale LSI. Therefore, generating an effective bridging fault test pattern making full use of the information also takes an enormous amount of time.

When the value of resistance between wires of the wire pair exceeds a certain value (detection limit resistance value Rc), even if a bridging fault exists, it will no longer influence the operation of the LSI. There is a proposal of a technique of modeling a bridging fault with information on a section where the value of resistance between wires of the wire pair ranges from 0Ω to Rc (hereinafter referred to as "resistance interval") added and simulating a resistive bridging fault using a given test pattern.

This technique causes information on the resistance interval to propagate on the target circuit together with each bridging fault while calculating variations in the interval and thereby enables the presence/absence of detection of each bridging fault using a test pattern to be outputted together with resistance interval information.

Furthermore, from the standpoint of improving accuracy of fault detection, it is important to handle a so-called "feedback bridging fault" whereby one signal of the wire pair extracted as the bridging fault is influenced by the other signal. There is a proposal of a bridging fault test where the above described simulation technique is applied to a feedback bridging fault.

However, since these techniques calculate the detection limit resistance value Rc using the gate width of a cell, the calculation expression becomes complicated. Furthermore, a latest cell library generally includes cells having a complicated configuration such as a composite gate and may not secure sufficient accuracy in a cell library used for an LSI.

In this way, it has been difficult to create a test pattern with a resistive bridging fault and feedback bridging fault taken into consideration, capable of high accuracy and practical bridging fault detection.

SUMMARY OF THE INVENTION

According to one aspect of the present invention, there is provided an apparatus for creating a test pattern and calculating a fault coverage or the like, comprising:

a bridging fault voltage calculation section that creates bridging fault voltage information indicating a relationship between logical values of input signals of a plurality of cells and voltages of bridging points assumed on (the wires derived from) output terminals of the plurality of cells and including supply current value information;

a logical threshold calculation section that creates logical threshold information by calculating logical thresholds of input terminals of the plurality of cells;

a bridging fault information extraction section that extracts bridging fault information including signal information on an adjacent wire pair whose inter-wire distance is within a predetermined short distance range, a wiring length of the adjacent wire pair, information on an input terminal of a drive cell that drives the adjacent wire pair and information on an input terminal of a reception cell to which a signal propagating to the adjacent wire pair is inputted, from layout information of a semiconductor integrated circuit;

a detection limit resistance value calculation section that calculates a detection limit resistance value based on a voltage of the bridging point included in the bridging fault voltage information and the supply current value information and a distribution of logical thresholds of a cell included in the logical threshold information and to which the bridging point is connected, adds information on the detection limit resistance value to the bridging fault voltage information and creates extended bridging fault voltage information;

a bridging fault list creation section that creates a bridging fault list including a bridging fault type determined by a relationship between a voltage of the bridging point and logical threshold of the input terminal of the reception cell using the bridging fault information, the logical threshold information and the extended bridging fault voltage information;

a test pattern creation section that creates a test pattern for detecting bridging faults in the adjacent wire pair using the bridging fault list, judges whether the bridging faults included in the bridging fault list can be detected according to the test pattern and creates fault detection information; and a fault coverage or the like calculation section that calculates a bridging fault coverage and a bridging fault residual ratio of the test pattern weighted with an integral value of a bridging fault resistance value distribution in a detection resistance area according to the test pattern based on the detection limit resistance value and the wiring length using bridging fault occurrence rate information including the fault detection information and bridging fault resistance value distribution information.

According to one aspect of the present invention, there is provided a method for creating a test pattern and calculating a fault coverage or the like, comprising:

creating bridging fault voltage information indicating a relationship between logical values of input signals of a plurality of cells and voltages of bridging points assumed on (the wires derived from) output terminals of the plurality of cells and including supply current value information;

creating logical threshold information by calculating logical thresholds of input terminals of the plurality of cells;

extracting bridging fault information including signal information on an adjacent wire pair whose inter-wire distance is within a predetermined short distance range, a wiring length of the adjacent wire pair, input information on a drive cell that drives the adjacent wire pair and input information on a reception cell to which a signal propagating to the adjacent wire pair is inputted, from layout information of a semiconductor integrated circuit;

calculating a detection limit resistance value based on a voltage of the bridging point included in the bridging fault voltage information and the supply current value information and a distribution of logical thresholds of a cell included in the logical threshold information and to which the bridging point is connected, adding information on the detection limit resistance value to the bridging fault voltage information and creating extended bridging fault voltage information;

creating a bridging fault list including a bridging fault type determined by a relationship between a voltage of the bridging point and logical threshold of the input terminal of the reception cell using the bridging fault information, the logical threshold information and the extended bridging fault voltage information;

creating a test pattern for detecting bridging faults in the adjacent wire pair and bridging fault type using the bridging fault list, judging whether the bridging faults included in the bridging fault list can be detected according to the test pattern and creating fault detection information; and calculating a bridging fault coverage and bridging fault residual ratio of the test pattern weighted with an integral value of a bridging fault resistance value distribution in a detection resistance area according to the test pattern based on the detection limit resistance value and the wiring length using the fault detection information and bridging fault occurrence rate information.

According to one aspect of the present invention, there is provided an apparatus for creating a test pattern and calculating a fault coverage or the like, comprising:

a bridging fault voltage calculation section that creates bridging fault voltage information indicating a relationship between logical values of input signals of a plurality of cells and voltages of bridging points assumed on (the wires derived from) output terminals of the plurality of cells and including supply current value information, further including the information when a cell that drives one of two output terminals making up the bridging comprises one logical gate and the outputs of the cell are connected to an input of the same cell;

a logical threshold calculation section that creates logical threshold information by calculating logical thresholds of input terminals of the plurality of cells;

a bridging fault information extraction section that extracts from layout information of a semiconductor integrated circuit bridging fault information including signal information on an adjacent wire pair whose inter-wire distance is within a predetermined short distance range, a wiring length of the adjacent wire pair, information on an input terminal of a drive cell that drives the adjacent wire pair and information on an input terminal of a reception cell to which a signal propagating to the adjacent wire pair is inputted;

a searching section that traces a signal inputted to the drive cell back to an input side of the semiconductor integrated circuit or traces an output signal of the drive cell to an output side of the semiconductor integrated circuit, searches whether or not wires of the adjacent wire pair are connected and detects, when the wires are connected and a feedback bridging fault is formed, whether the number of signal inversions between the connected points and the drive cell is an even number or odd number and creates search result information;

a bridging fault list creation section that creates a bridging fault list including a bridging fault type determined by a relationship between a voltage of the bridging point and logical threshold of the input terminal of the reception cell and a special fault accompanying a feedback bridging fault using the bridging fault information, the search result information, the logical threshold information and the bridging fault voltage information;

a test pattern creation section that creates a test pattern for detecting bridging faults in the adjacent wire pair using the bridging fault list, judges whether the bridging faults included in the bridging fault list can be detected according to the test pattern and creates fault detection information; and a fault coverage calculation section that calculates a bridging fault coverage and bridging fault residual ratio of the test pattern weighted with the wiring length and bridging fault occurrence rate using the fault detection information and bridging fault occurrence rate information.

BRIEF DESCRIPTION OF THE DRAWINGS

FIG. 3 shows a format example of bridging fault voltage information according to the first embodiment of the present invention;

FIG. 8 shows a description example of a detection limit resistance value;

FIG. 9 shows a format example of extended bridging fault voltage information according to the first embodiment of the present invention;

FIG. 13 shows a format example of bridging fault information according to the first embodiment of the present invention;

FIG. 14 shows a format example of a detailed bridging fault list according to the first embodiment of the present invention;

FIG. 15 shows a format example of a simple bridging fault list according to the first embodiment of the present invention;

FIG. 21 shows a format example of bridging fault voltage information according to the second embodiment of the present invention;

FIG. 22 shows a format example of search result information according to the second embodiment of the present invention;

FIG. 24 shows a format example of a detailed bridging fault list according to the second embodiment of the present invention;

FIG. 25 shows a format example of a simple bridging fault list according to the second embodiment of the present invention.

DESCRIPTION OF THE EMBODIMENTS

Hereinafter, an apparatus for creating a test pattern and calculating a fault coverage or the like according to embodiments of the present invention will be explained.

First Embodiment

Figure 1:
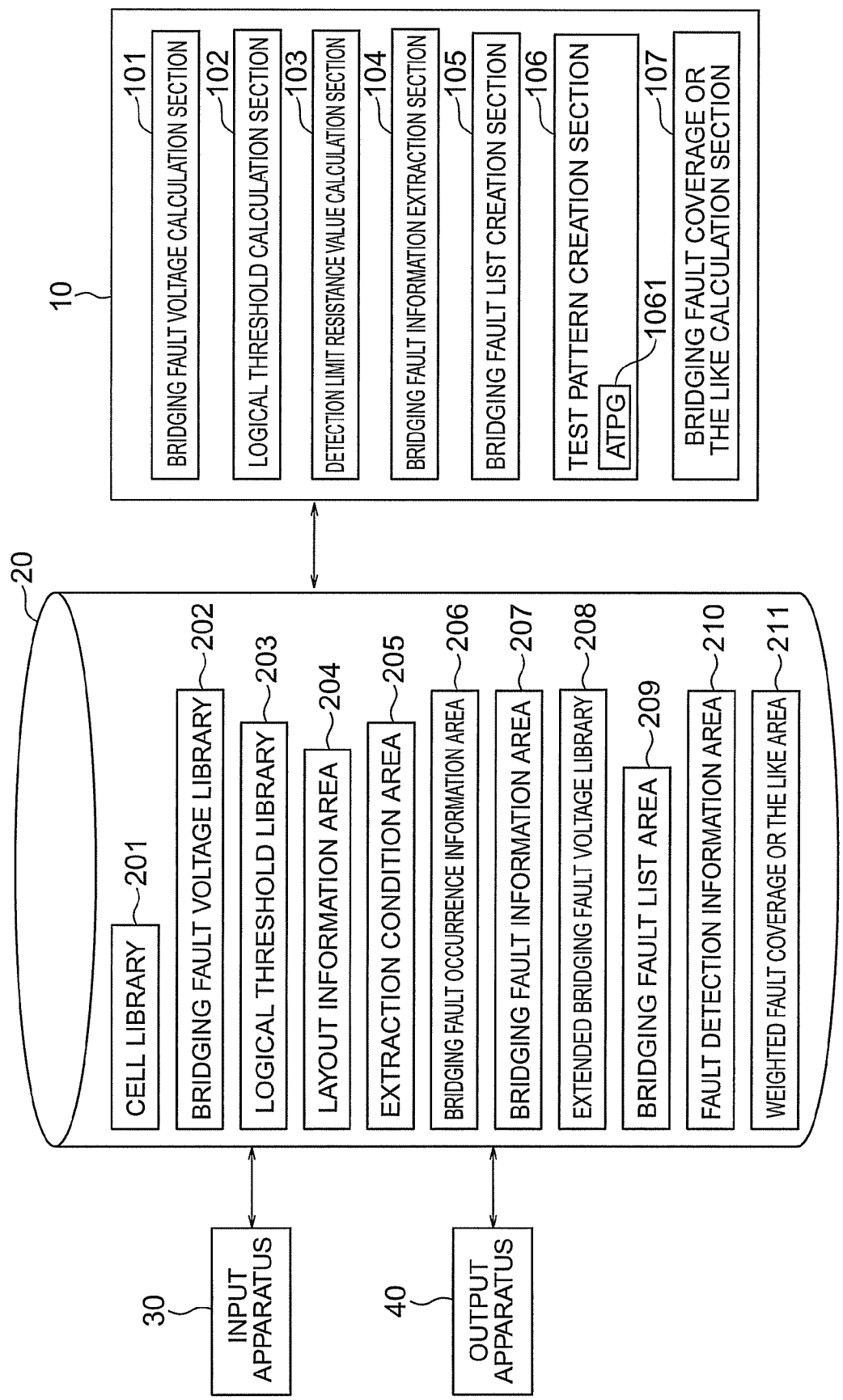
FIG. 1 shows a schematic configuration of an apparatus for creating a test pattern and calculating a fault coverage or the like according to a first embodiment of the present invention.

FIG. 1 shows a schematic configuration of an apparatus for creating a test pattern and calculating a fault coverage or the like according to a first embodiment of the present invention.

A bridging fault voltage calculation section 101 calculates voltages of short-circuited points assumed on wires derived from arbitrary output terminals of a plurality of cells. A logical threshold calculation section 102 calculates a logical threshold of input terminals of the plurality of cells and creates logical threshold information.

A detection limit resistance value calculation section 103 calculates a detection limit resistance value of each bridging fault and creates extended bridging fault voltage information.

A bridging fault information extraction section 104 extracts bridging fault information including signal information on an adjacent wire pair whose inter-wire distance is within a predetermined short distance range and information on a drive cells or the like.

A bridging fault list creation section 105 creates a bridging fault list using the bridging fault information, logical threshold information and extended bridging fault voltage information.

A bridging fault test pattern creation section 106 creates a test pattern for detecting a bridging fault of an adjacent wire pair using the bridging fault list. The bridging fault test pattern creation section 106 then executes a fault simulation using this test pattern, writes information including the input information of each detected bridging fault into the bridging fault list and creates bridging fault detection information.

A bridging fault coverage or the like calculation section 107 calculates a weighted bridging fault coverage, bridging fault residual ratio (or more simply, total adjacent wiring length of undetected fault) based on information inputted to a cell that drives each bridging fault, a detection limit resistance value corresponding to a logical threshold of the connection target, bridging fault resistance value distribution and wiring length of each bridging fault.

The bridging fault voltage calculation section 101, logical threshold calculation section 102, detection limit resistance value calculation section 103, bridging fault information extraction section 104, bridging fault list creation section 105, bridging fault test pattern creation section 106 and bridging fault coverage or the like calculation section 107 are included in a central processing unit 10.

The apparatus for creating a test pattern and calculating a fault coverage or the like is further provided with a storage 20, an input apparatus 30 and an output apparatus 40.

The storage 20 is provided with a cell library 201, a bridging fault voltage library 202, a logical threshold library 203, a layout information area 204, an extraction condition area 205, a bridging fault occurrence information area 206, a bridging fault information area 207, an extended bridging fault voltage library 208, a bridging fault list area 209, a bridging fault detection information area 210 and a weighted fault coverage or the like area 211.

The cell library 201 stores a cell ATPG/fault simulation model and a cell circuit simulation model. The bridging fault voltage library 202 stores bridging fault voltages and supply current information of respective bridging faults between outputs of cells. The logical threshold library 203 stores logical threshold information on input terminals of respective cells.

The layout information area 204 stores layout information on an LSI which is a bridging fault detection test target (hereinafter referred to as a "target LSI"). The extraction condition area 205 stores a preset short (adjacent) distance.

The bridging fault occurrence information area 206 stores a bridging fault resistance value distribution and preferably bridging fault occurrence rate information including a bridging fault occurrence distribution by adjacent distance.

The bridging fault information area 207 stores bridging fault information extracted from the layout information. The extended bridging fault voltage library 208 stores extended bridging fault voltage information which is the bridging fault voltage information with detection limit resistance value information of each bridging fault added.

The bridging fault list area 209 stores a bridging fault list. The bridging fault detection information area 210 stores each bridging fault, detected/undetected information or preferably input information of the detected bridging fault. Furthermore, undetected faults may have been sorted in order of wiring length weights.

The weighted fault coverage or the like area 211 stores a weighted fault coverage of a test pattern for a bridging fault detection test or preferably bridging fault residual ratio (more simply, total adjacent wiring length of undetected faults) or the like.

The input apparatus 30 is a keyboard, mouse, hard disk drive (including also a portable type) and a reader for a portable type external storage medium such as CD-ROM, DVD, USB memory.

The output apparatus 40 is a display, printer, external storage, external storage connected via a network including the central processing unit 10, hard disk drive (including also a portable type), writer for a portable type external storage medium such as CD-ROM, DVD, USB memory.

Figure 2:
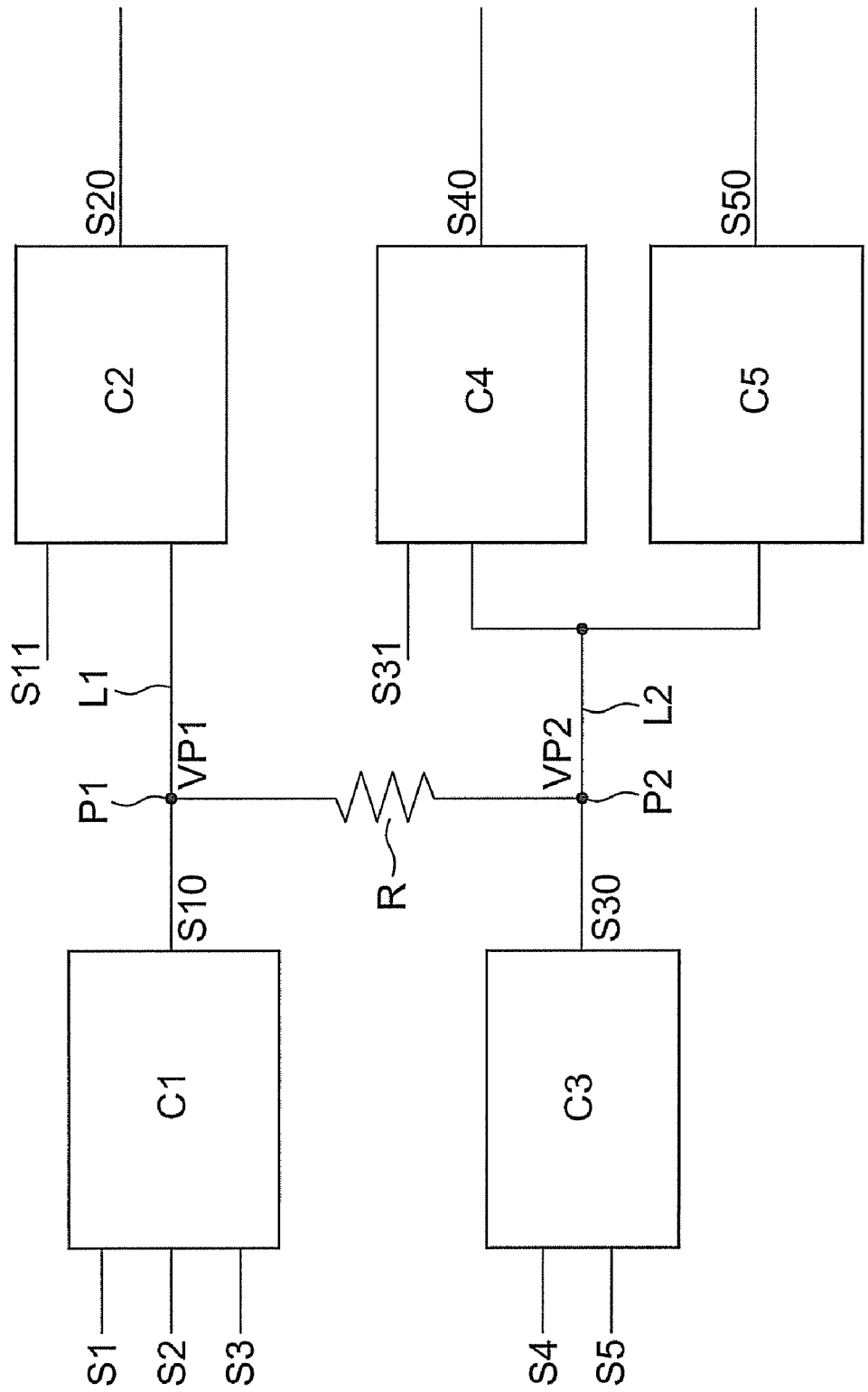
FIG. 2 is a circuit diagram showing an example of a bridging fault.

An example of bridging fault will be explained using FIG. 2. FIG. 2 shows an example where a wire L1 connecting a drive cell C1 and a reception cell C2 is short-circuited with a wire L2 connecting a drive cell C3 with reception cells C4 and C5 via a resistor R. The drive cell C1 is given signals S1, S2 and S3 and outputs a signal S10 to the reception cell C2. The reception cell C2 is further given a signal S11 and outputs a signal S20.

The drive cell C3 is given signals S4 and S5 and outputs a signal S30 to the reception cells C4 and C5. The reception cell C4 is further given a signal S31 and outputs a signal S40. The reception cell C5 outputs a signal S50.

Whether or not this bridging fault is propagated to the output terminal of a target LSI is determined by a relationship between a voltage VP1 at a connection point P1 between the wire L1 and the resistor R, a voltage VP2 at a connection point P2 between the wire L2 and the resistor R, and logical thresholds of the input terminals of the reception cells C2, C4 and C5.

For example, when the signal S10 is low level and the signal S30 is high level, the voltage VP1 is equal to or higher than the logical threshold of the input terminal of the reception cell C2 and if the value of the signal S11 is set so that the logical value of the signal S10 can propagate to the output signal S20 of the cell C2, the output of the reception cell C2 changes to that different from that in fault-free operation.

That is, an error signal produced by a bridging fault propagates to the output terminal of the target LSI via the reception cell C2 and the bridging fault is detected.

However, when the voltage VP1 is less than the logical threshold of the input terminal of the reception cell C2, even if the value of the signal S11 is set so that the logical value of the signal S10 can propagate to the output signal S20 of the cell C2, the bridging fault cannot cause the output of the reception cell C2 to change to that different from that in fault-free operation.

That is, an error signal caused by the bridging fault does not propagate to the output terminal of the target LSI via the reception cell C2 and the bridging fault is not detected.

In this case, when the voltage VP2 is less than the logical threshold of the input terminal of the reception cell C4 and if the value of the signal S31 is set so that the logical value of the signal S30 can propagate to the output signal S40 of the cell C4, an error signal caused by the bridging fault propagates to the output terminal of the target LSI via the reception cell C4 and the bridging fault can be detected.

Furthermore, if the voltage VP2 is less than the logical threshold of the input terminal of the reception cell C5, an error signal caused by the bridging fault propagates to the output terminal of the target LSI via the reception cell C5 and the bridging fault can be detected. That is, the bridging fault can be detected with an appropriate test pattern.

More specifically, when the bridging fault is activated, whether or not the output of the reception cell changes may depend on the logical values of side input signals other than the input signal, related to the bridging fault inputted to the reception cell. When, for example, the reception cell is a composite logical gate, the logical threshold of the input terminal to which the signal related to the bridging fault is inputted may change depending on the logical values of these signals.

Furthermore, the voltages VP1 and VP2 depend on the value of the resistor R, the logical values of the input signals S1 to S3 of the drive cell C1 and the logical values of the input signals S4 and S5 of the drive cell C3.

Therefore, whether or not the bridging fault at the wire pair (L1, L2) can propagate through the target LSI via the reception cells (C2, C4, C5) depends on the combination of logical values of the output signals of the drive cells, the combination of logical values of the input signals of the drive cells and the combination of logical thresholds of the input terminals of the reception cells.

It also depends on logical values of input signals other than the signals related to the bridging fault of the reception cells (except small influences on the logical thresholds), but these are generally processed by the ATPG and will be handled separately (as a general function of the ATPG) in this embodiment.

The bridging fault voltage calculation section 101 targets all combinations of drive cells that can drive the wire pair, calculates the voltage of short-circuited (bridging) points assumed for the wire pair through a circuit simulation in consideration of logical values of two arbitrary output signals of the plurality of drive cells and logical values of input signals of the drive cells or the like and creates bridging fault voltage information.

The bridging fault voltage calculation section 101 reads the circuit description for a circuit simulation of the cells from the cell library 201 and an operation model for a circuit simulation of elements used in the circuit description and creates a net list for a circuit simulation with two arbitrary cell outputs short-circuited via the resistor R. The net list created includes a net list with two outputs of the same cell short-circuited.

The bridging fault voltage calculation section 101 executes a circuit simulation for all combinations of possible inputs about the created net list. Here, the resistance value of the resistor R is assumed to be 0.

The bridging fault voltage calculation section 101 extracts the voltage (bridging fault voltage) of the short-circuited point from the circuit simulation result. Information on the extracted bridging fault voltage or the like is stored in the bridging fault voltage library 202 as bridging fault voltage information.

The bridging fault voltage calculation section 101 creates the above described bridging fault voltage information on all (simplified) combinations of two arbitrary cell outputs included in the cell library 201. The meaning of "simplification" will be described later. Here, bridging fault voltage information may also be created only for cells used for the target LSI.

A format example of bridging fault voltage information is shown in FIG. 3. As shown in FIG. 3, bridging fault voltage information is created for all (simplified) combinations of inputs of cell A and inputs of cell B. In this case, it is preferable to also create a value of a DC current that flows because of the existence of the bridging fault. The item "frequency of input" shown in FIG. 3 will be described later.

Figures 4, 5:
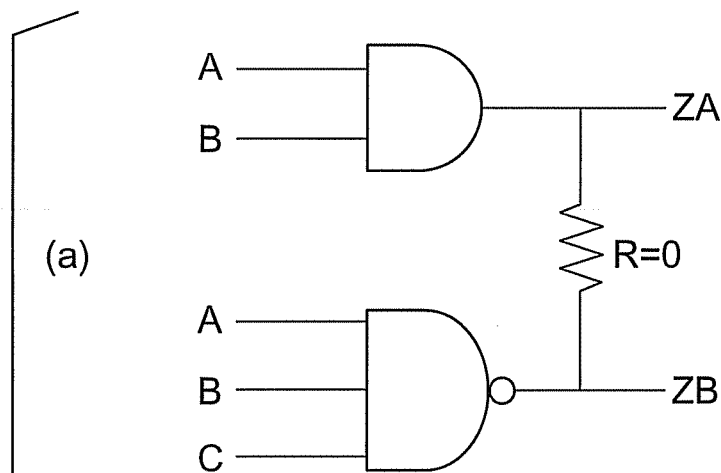
FIG. 4 shows another format example of bridging fault voltage information according to the first embodiment of the present invention.
FIG. 5 shows an example of information resulting from grouping combinations of inputs according to the first embodiment of the present invention.

FIG. 4 shows a more specific example of the bridging fault voltage information. FIG. 4 shows the bridging fault voltage information when the output terminal of an AND circuit AND2 is short-circuited with the output terminal of an NOR circuit NOR3. As shown in FIG. 4, signals A and B are inputted to the AND circuit AND2 and a signal Z is outputted. Furthermore, the signals A, B and C are inputted to the NOR circuit NOR3 and signal Z is outputted. "u" as the unit of the DC current (current flowing through the bridging fault point) is µA.

For example, when the signals A and B inputted to the AND circuit AND2 and the signals A, B and C inputted to the NOR circuit NOR3 are all 0, the logical value of the signal Z outputted from the AND circuit AND2 is 0, the logical value of the signal Z outputted from the NOR circuit NOR3 is 1, the bridging fault voltage is 0.681 V, and the DC current value is 635 µA.

The item "frequency of input" indicates the number of combinations of substantially the same input of the AND circuit AND2 and NOR circuit NOR3. For example, since there are three combinations of input (1, 0, 0) where any one of the signals A, B and C inputted to the NOR circuit NOR3 is 0, the frequency of input is 3. On the other hand, since there is only one combination of input (1, 1, 1) where all the signals A, B and C inputted to the NOR circuit NOR3 are 1, the frequency of input is 1.

As described above, expressing combinations of a plurality of substantially equivalent inputs with representative one (left-leaning "1" is selected in FIG. 4) is called a "simplified" expression. The following "grouping" is an expression of "simplification" from an angle of the way in which individual inputs are organized.

FIG. 5(b) shows information resulting from grouping combinations of inputs of the NAND circuit shown in FIG. 5(a). When the combinations of inputs of the NAND circuit are substantially the same from the standpoint of a load driving force of the output signal, these combinations are classified as the same group.

The number of groups of the NAND circuit where the logical value of the output signal Z is 1 is 3. Group 1 is a combination of inputs where any one of the input signals A, B and C is 1 and the frequency of input is 3. Group 2 is a combination of inputs where any one of the input signals A, B and C is 0 and the frequency of input is 3. Group 3 is a combination of inputs where all of the input signals A, B and C are 0 and the frequency of input is 1.

Since the bridging fault voltage and the DC current value are substantially the same in the same group, it is preferable to consider whether or not a bridging fault can be detected for one combination of inputs in the group. That is, using grouping information is important in reducing an overall amount of calculations and securing high accuracy within a range of allowable amount of calculation.

For a cell such as a NAND circuit and NOR circuit, the load driving force of the cell varies depending on the input. For example, in the example shown in FIG. 5(b), the descending order of "1" driving force of load is group 3, group 1, group 2.

However, since cells such as AND circuit and OR circuit have a buffer for increasing the load driving force in the output portion, when the same logical value is outputted, attention should be paid to the point that the load driving force is the same.

In addition to basic cells such as AND circuit and OR circuit, a large-scale hard macro block such as a memory may also be a bridging fault detection target.

Figures 6, 7:
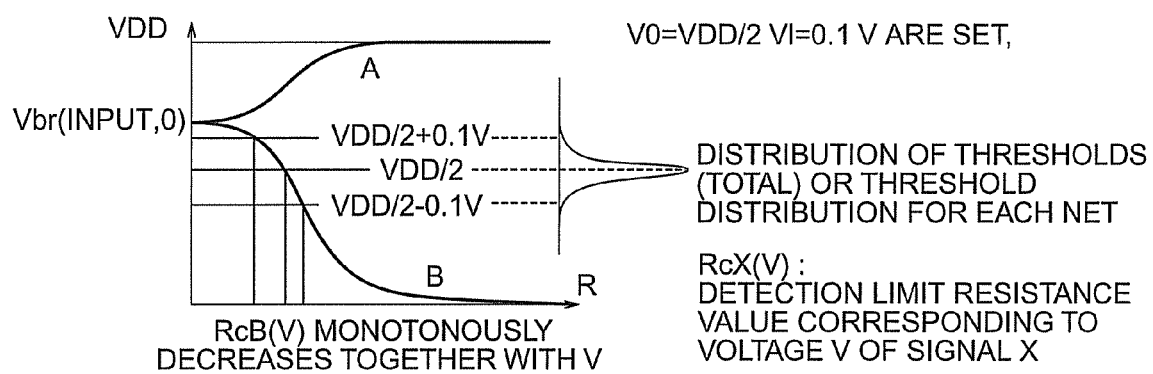
FIG. 6 shows a format example of logical threshold information according to the first embodiment of the present invention.
FIG. 7 shows an example of a detection limit resistance value.

The logical threshold calculation section 102 executes a circuit simulation while changing the input voltage of one arbitrary input of each input group of the cell by a very small value, calculates the input voltage (logical threshold) when the logical value of the output changes and creates logical threshold information. FIG. 6 shows a format example of the logical threshold information.

The logical threshold may differ depending on whether the input is changed from 1 to 0 or changed from 0 to 1. Furthermore, the logical threshold may change depending on the value of a side input signal which is a signal other than the signal in which a bridging fault has occurred.

For these cases, the format may be extended or simplified in consideration of a balance with the CPU time estimated from the necessary accuracy and LSI scale applied as appropriate. For example, in the case of simplification, when the logical threshold varies depending on the direction of variation in an input logical value, the mean value thereof is defined as the logical threshold.

The detection limit resistance value calculation section 103 calculates a detection limit resistance value of each bridging fault based on the bridging fault voltage information created by the bridging fault voltage calculation section 101 and the logical threshold information created by the logical threshold calculation section 102.

The detection limit resistance value calculation section 103 calculates the detection limit resistance value with respect to the voltage corresponding to a peak value (or mean value) and base value of a logical threshold distribution of the connecting cell of the wire pair and stores the value in the extended bridging fault voltage library 208.

More specifically, the detection limit resistance value calculation section 103 acquires a distribution of the logical threshold of the cell from the logical threshold information, applies it to the distributions of the voltage V0 corresponding to a peak of the distribution and the voltage difference V1 corresponding to a range from the peak to the end of the base, calculates a detection limit resistance value Rc of the bridging fault corresponding to V0−V1, V0 and V0+V1, adds the detection limit resistance value information to the bridging fault voltage information, creates extended bridging fault voltage information and stores it in the extended bridging fault voltage library 208.

The bridging fault voltages of the signal A and signal B propagating through the wire pair generally vary due to the existence of the resistor R, but the detection limit resistance value Rc also has a meaning of lower limit value at which the bridging fault ceases to trigger a logical malfunction.

As shown in FIG. 7, it is only three detection limit resistance values of the signal A or signal B corresponding to V0−V1, V0 and V0+V1 that have valid meanings for the bridging fault coverage or the like and these three values are stored in the extended bridging fault voltage library 208.

Depending on the magnitude relationship between bridging fault voltage Vbr(0) and V0−V1, V0, V0+V1 when the resistance R=0, the detection limit resistance value information stored in the extended bridging fault voltage library 208 belongs to any one of the signal A and signal B.

As shown in FIG. 8, the signal A and signal B are distinguished by ",". As shown in FIG. 8(*a*), when the signal A=1, B=0, detection limit resistance values Rc are arranged in descending order of V from the left side and the signals A and B are distinguished by ",". On the other hand, when the signal A=0, B=1, the detection limit resistance values Rc are arranged in ascending order of V from the left side and the signals A and B are distinguished by ",". A more specific example of this is shown in FIG. 8(*b*). The unit of resistance value is Ω.

FIG. 9 shows a format example of extended bridging fault voltage information. This corresponds to the format example of the bridging fault voltage information shown in FIG. 3 additionally provided with detection limit resistance values Rc when the bridging fault voltage is V0−V1, V0 and V0+V1, DC current value, relative probability of occurrence when the bridging fault voltage is V0 and information on the bridging fault type when R=0. It is therefore possible that, if R>0 is considered, only the extended bridging fault voltage information is generated without the bridging fault voltage information.

The item "relative probability of occurrence" is a probability that a combination of specific inputs may occur, and the relative probability of occurrence here is assumed to be a value obtained by dividing the frequency of input of combinations of input signals of the cells that output the signal A and signal B by the number of all possible combinations.

To be more exact, the relative probability of occurrence may also be calculated by exactly calculating the probability that the logical value of each input signal may become 0 or 1.

That is, the greater the frequency of input of a combination of input signals, the greater the relative probability of occurrence becomes.

The item "bridging fault type" allows type classification based on an "Aggressor-Victim" relationship as shown in Table 1. Here, "Aggressor" is used to mean a signal that acts to forcibly change the logical value of the other party and "Victim" is used to mean a signal whose logical value is forcibly changed by "Aggressor." "F" and "S" indicate that the first and second signals of a bridging fault pair are Aggressors respectively.

Figures 10, 11:
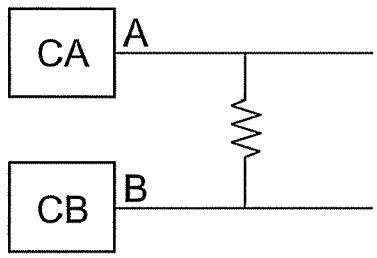
FIG. 10 shows basic four types of bridging fault.
FIG. 11 shows a format example of extended bridging fault voltage information according to the first embodiment of the present invention.

This type classification is equivalent to four basic types of bridging fault as shown in FIG. 10 (wired OR, wired AND, A dominate, B dominate). FIG. 10 shows bridging faults of the four basic types that propagate assuming a bridging fault between the output terminal of a cell CA that outputs a signal A and the output terminal of a cell CB that outputs a signal B. On the other hand, faults that actually occur may also fall outside the four basic types, but there is an advantage that the specification can be easily extended even in such a case.

TABLE 1

| Fault type | Symbol | Meaning |
|---|---|---|
| F0 A B | F0 | When 0 is set in 1st signal (A), 2nd signal (B) changes 1 → 0. |
| F1 A B | F1 | When 1 is set in 1st signal (A), 2nd signal (B) changes 0 → 1. |
| S0 A B | S0 | When 0 is set in 2nd signal (B), 1st signal (A) changes 1 → 0. |
| S1 A B | S1 | When 1 is set in 2nd signal (B), 1st signal (A) changes 0 → 1. |

A specific example of the extended bridging fault voltage information is shown in FIG. 11. FIG. 11 shows bridging fault voltage information when the output terminal of the AND circuit AN2 and the output terminal of the NOR circuit NR3 are short-circuited. As shown in FIG. 11, the signals A and B are inputted to the AND circuit AN2 and a signal Z is outputted. Furthermore, signals A, B and C are inputted to the NOR circuit NR3 and a signal Z is outputted.

For example, when the signals A and B inputted to the AND circuit AN2, the signals A, B and C inputted to the NOR circuit NR3 are all 0, the logical value of the signal Z outputted from the AND circuit AN2 is 0 and the logical value of signal Z outputted from the NOR circuit NR3 is 1. Furthermore, when R=0, the bridging fault voltage is 0.319 V and the DC current value is 299 μA.

Furthermore, the detection limit resistance values when the bridging fault voltages are assumed to be V0−V1, V0, V0+V1 are 1799Ω, 1679Ω, 1540Ω respectively and the DC current value when the bridging fault voltage is assumed to be V0 is 0.134 mA. Furthermore, the relative probability of occurrence (when the output (of the AND circuit AN2) Z=0, the output (of the NOR circuit NR3) Z=1) is 1 and the bridging fault type when R=0 is F0. Furthermore, from the position of "," it is apparent that the detection limit resistance value belongs to the signal A.

Figure 12:
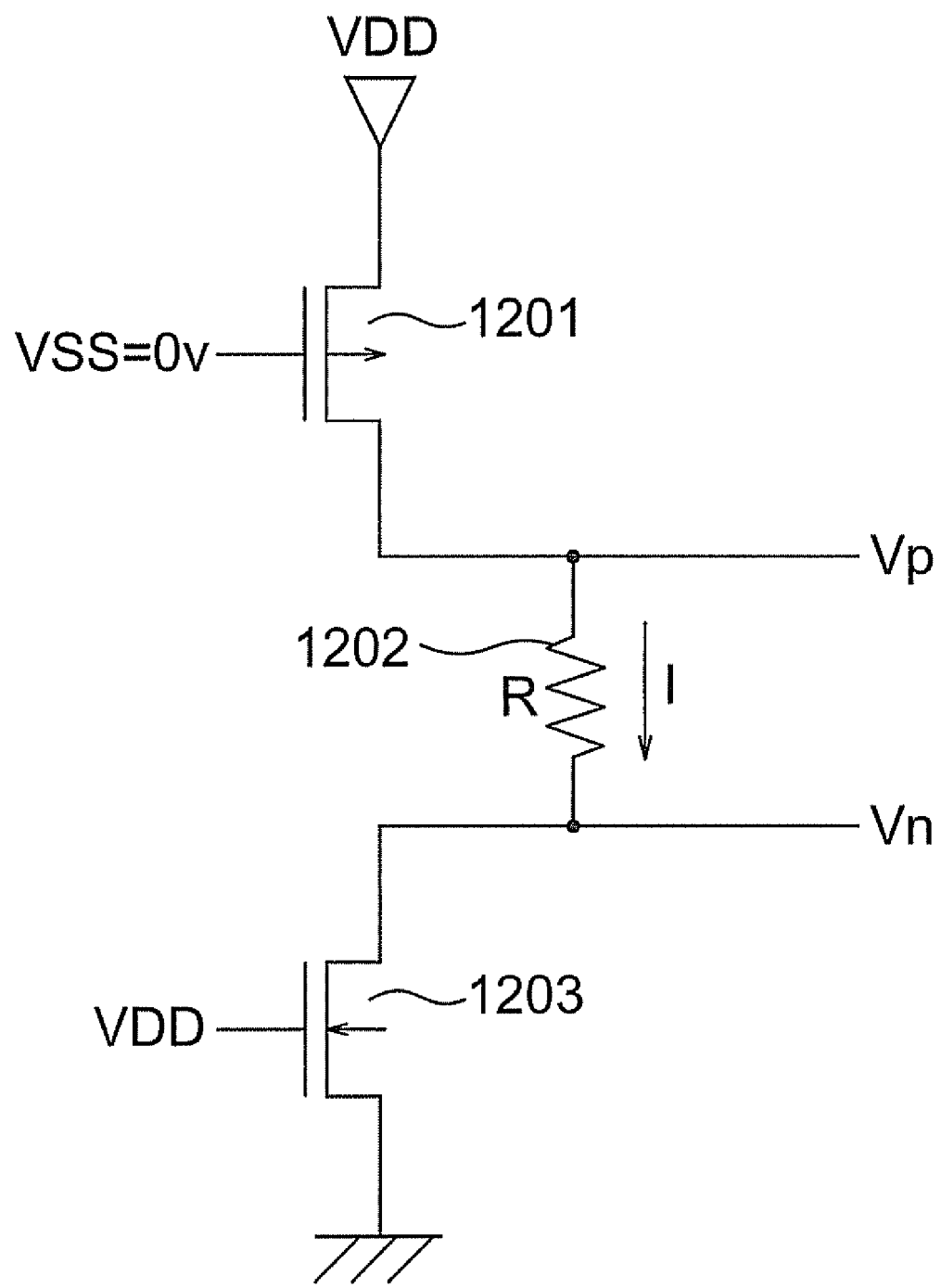
FIG. 12 is a circuit diagram which approximates a resistive bridging fault.

The bridging fault accompanied by the resistor R(>0) can be effectively approximated as a series circuit of one PMOS transistor 1201, resistor 1202, NMOS transistor 1203 as shown in FIG. 12 at a practical level. Therefore, the following relational expression is derived when calculating the detection limit resistance value Rc that satisfies Vbr(R)=VDD/2 (=V0) or the like using the bridging fault voltage Vbr(0) and short-circuited current Ibr(0) included in the bridging fault voltage information when resistance R=0. "β" is a constant that depends on a gate width W and a gate length L.

1) When Vbr(0)>Vtn and Vbr(0)>Vtp $$Ip(R) = \beta p\{(VDD-Vtp)(VDD-Vp(R))-(VDD-Vp(R))^2/2\} = I(R) \quad (1)$$

$$In(R) = \beta n\{(VDD-Vtn)Vn(R)-Vn(R)^2/2\} = I(R) \quad (2)$$

$$R \cdot I(R) = Vp(R) - Vn(R) \quad (3)$$

where, βp: constant that depends on PMOS(Wp/Lp), βn: constant that depends on NMOS(Wn/Ln), Vtp: threshold of PMOS, Vtn: threshold of NMOS Here, from the data (Ip(0)=In(0)=Ibr(0), Vn(0)=Vp(0)=Vbr(0)) obtained when the already obtained resistance R=0, $$\beta p = Ip(0)/\{(VDD-Vtp)(VDD-Vp(0))-(VDD-Vp(0))^2/2\}$$

$$\beta n = In(0)/\{(VDD-Vtn)Vn(0)-Vn(0)^2/2\}$$

and using this, $$\beta p/\beta n = \{(VDD-Vtn)Vbr(0)-Vbr(0)^2/2\}/\{(VDD-Vtp)(VDD-Vbr(0))-(VDD-Vbr(0))^2/2\}$$

are obtained. As an example, the method of calculating the resistance R which satisfies Vp=VP (=VDD/2−0.1 V, VDD/2, VDD/2+0.1 V) is shown below.

$$\beta p/\beta n\{(VDD-Vtp)(VDD-VP)-(VDD-VP)^2/2\} = (VDD-Vtn)Vn-Vn^2/2 Vn^2-2(VDD-Vtn)Vn+2\beta p/\beta n\{(VDD-Vtp)(VDD-VP)-(VDD-VP)^2/2\}=0$$

$$Vn(R) = (VDD - Vtn) - \sqrt{(VDD-Vtn)^2 - 2\beta p/\beta n\{(VDD-Vtp)(VDD-VP)-(VDD-VP)^2/2\}} \quad \text{[Formula 1]}$$

I(R) is obtained by substituting Vn(R) calculated above into Expression (3). Therefore, the detection limit resistance value Rc is obtained from $$Rc = (VP-Vn)\{(VDD-Vtn)Vbr(0)-Vbr(0)^2/2\}/\{(VDD-Vtn)Vn-Vn^2/2\}/Ibr(0)$$

2) When Vbr(0)>VDD−Vtn (NMOS pinch-off area when R=0, gate width of NMOS is small), detection limit resistance Rc (VDD/2 or the like, triode area) is detected, for the signal on the side where NMOS is ON (which drives 0) (necessarily Vp>VDD/2+0.1 V, and there is no solution such as Vp=VDD/2). Therefore, Expression (2) of the NMOS current when R=0 is changed to $In(0)=\beta n(VDD-Vtn)^2/2$, $$In(0) = Ip(0)$$
$$= \beta p\{(VDD-Vtp)(VDD-Vp(0)) - (VDD-Vp(0))^2/2\}, \text{ and}$$

$$\beta n/\beta p = \{2(VDD-Vtp)(VDD-Vbr(0)) - (VDD-Vbr(0))^2\}/(VDD-Vtn)^2$$

$$In(R) = \beta n\{(VDD-Vtn)\cdot Vn(R) - Vn(R)^2/2\}$$
$$= 2In(0)/(VDD-Vtn)^2 \cdot \{(VDD-Vtn)/Vn(R) - Vn(R)^2/2\}$$
$$= Ibr(0) \cdot \{2(VDD-Vtn)\cdot Vn(R) - Vn(R)^2\}/(VDD-Vtn)^2$$

On the other hand, from Ip(R)=In(R), Vn=VN (=VDD/2−0.1 V, VDD/2, VDD/2+0.1 V) and $$(VDD-Vtp)(VDD-Vp)-(VDD-Vp)^2/2 = \beta n/\beta p\{(VDD-Vtn)\cdot VN-VN^2/2\}(VDD-Vp)^2-2(VDD-Vtp)(VDD-Vp)+\beta n/\beta p\{2(VDD-Vtn)/VN-VN^2\}=0$$

and therefore $$(VDD - Vp) = (VDD - Vtp) - \sqrt{(VDD-Vtp)^2 - \beta n/\beta p\{2(VDD-Vtn)\cdot VN - VN^2\}} \quad \text{[Formula 2]}$$

$$Vp = Vtp + \sqrt{(VDD-Vtp)^2 - \beta n/\beta p\{2(VDD-Vtn)\cdot VN - VN^2\}}$$

Furthermore, since Vp−Vn=R·In(R), detection limit resistance value Rc is obtained from $$Rc = (Vp(R)-VN)(VDD-Vtn)^2/\{2(VDD-Vtn)/VN-VN^2\}/Ibr(0)$$

3) When VDD−Vbr(0)>VDD−Vtp, that is, Vbr(0)<Vtp (when R=0, PMOS pinch-off area and gate width of PMOS are small), the detection limit resistance Rc (VDD/2 or the like, triode area) is detected for a signal on the side where PMOS is ON (that drives 1) (always Vn<VDD/2−0.1 V, there is no solution such as Vn=VDD/2). In Expression (1) of PMOS current when R=0, Ip is changed to $$Ip(0) = \beta p(VDD-Vtp)^2/2 \text{ and}$$

$$Ip(0) = In(0) = \beta n\{(VDD-Vtn)Vn(0)-Vn(0)^2/2\}$$

is obtained, Therefore, $$\beta p/\beta n = \{2(VDD-Vtn)\cdot Vbr(0) - Vbr(0)^2\}/(VDD-Vtp)^2$$

$$Ip(R) = \beta p\{(VDD-Vtp)(VDD-Vp(R)) - (VDD-Vp(R))^2/2\}$$
$$= 2Ip(0)/(VDD-Vtp)^2 \cdot \{(VDD-Vtp)(VDD-Vp(R)) - (VDD-Vp(R))^2/2\}$$
$$= Ip(0) \cdot \{2(VDD-Vtp)(VDD-Vp(R)) - (VDD-Vp(R))^2\}/(VDD-Vtp)^2$$

is obtained. On the other hand, from In(R)=Ip(R), Vp=VP (=VDD/2−0.1 V, VDD/2, VDD/2+0.1 V) (VDD−Vtn)Vn−Vn²/2=βp/βn{(VDD−Vtp)(VDD−VP)−(VDD−VP)²/2} and therefore, $$Vn(R) = VDD - Vtn - \sqrt{(VDD-Vtn)^2 - \beta p/\beta n\{(VDD-Vtp)(VDD-VP)-(VDD-VP)^2/2\}} \quad \text{[Formula 3]}$$

Furthermore, using Vp−Vn=R·Ip(R), the detection limit resistance value Rc can be obtained as $$Rc = (VP-Vn(R))(VDD-Vtp)^2/\{2(VDD-Vtp)(VDD-VP)-(VDD-VP)^2\}/Ibr(0)$$

Here, the detection limit resistance value Rc is calculated using the extract bridging fault voltage Vbr(0) when R=0 obtained through a circuit simulation and the data of the short-circuited current Ibr(0) and there is no need for calculations with the gate width of individual elements included in the basic cell explicitly displayed.

For this reason, information on the effective gate width accompanying the activation of the bridging fault can be incorporated in a natural form and practical accuracy is obtained. Furthermore, calculations can also be performed between signals having significantly different driving forces.

The detection limit resistance value Rc obtained in this way is added to the bridging fault voltage information calculated when R=0 and extended bridging fault voltage information corresponding to R>0 is created.

The bridging fault information extraction section 104 extracts bridging fault information on the adjacent wire pair within a short distance range included in the extraction condition area 205 from the layout information on the target LSI stored in the layout information area 204.

First, the short distance will be explained. The short distance is set as an inter-wire distance when a bridging fault occurs. For example, the inter-wire distance when the bridging fault occurrence rate becomes a certain probability or higher is set as the short distance based on the distribution or the like of the bridging fault occurrence rate with respect to the inter-wire distance.

The bridging fault occurrence rate depends on the inter-wire distance of the wire pair and the bridging fault occurrence rate generally decreases as the inter-wire distance increases. The bridging fault occurrence rate is calculated from an inspection result of bridging faults of a dedicated evaluation circuit created for each manufacturing process or LSIs manufactured in the past.

The bridging fault information extraction section 104 extracts bridging fault information including the wiring length of the adjacent wire pair whose inter-wire distance is within a short distance range (hereinafter referred to as "adjacent wiring length"), signal information on the adjacent wire pair, drive cell information on the drive cell for driving the adjacent wire pair and reception cell information on the reception cell to which a signal propagating through the adjacent wire pair is inputted from the wire position and connection detail information included in the layout information.

The signal information is detailed names in the target LSI of signals propagating through the adjacent wire pair respectively. The drive cell information includes the terminal name (drive terminal name) of the drive terminal that outputs signals to the adjacent wire pair. The reception cell information includes the terminal name (reception terminal name) of the reception terminal to which signals propagating through the adjacent wire pair are inputted.

FIG. 13 shows a format example of bridging fault information (signal pair of A and B). The bridging fault information includes detailed names including (detailed hierarchic) cell (or module) identification names in the net list of the LSI of the wire through which the signals A and B propagate, adjacent wiring length, terminal name of the drive terminal which outputs signals to the adjacent wire pair and terminal name (connecting input terminal name) of the cell to which each signal propagating through the adjacent wire pair is given.

"Instance name" shown in FIG. 13 is a cell identification name in the net list of the target LSI. A plurality of tristate buffers may be connected to a bus or the like and an "enable terminal name" together with a "drive terminal name" is included from the necessity when identifying the drive cell which produces a bridging fault.

The bridging fault information may also be created divided into a file listing target signal pairs and adjacent wiring lengths and a file describing information on a cell which drives each signal, the output terminal and information on the input terminal of the connecting cell of each signal. This can reduce the file size as a whole and is effective when extracting bridging faults of a large-scale LSI.

The bridging fault list creation section 105 creates a bridging fault list using the bridging fault information, extended bridging fault voltage information and logical threshold information. The bridging fault list created is stored in the bridging fault list area 209.

FIG. 14 shows a detailed format example of the bridging fault list on a bridging fault assumed on an adjacent wire pair made up of a wire through which the signal A propagates and a wire through which the signal B propagates.

"A(B) signal drive cell input value" indicates an input value of the cell which drives the signal A(B) when the corresponding bridging fault type can be detected and also indicates the corresponding detection limit resistance value.

"Detection information" indicates whether a bridging fault has been successfully detected and indicates, for example, a detected one as "D (detected)" and an undetected one as "UD (undetected)" and a redundant one (which will be described later) as "UT (untestable)." When a detailed bridging fault list is created, all bridging faults are normally labeled "UD."

"Detection accuracy" indicates the accuracy that a bridging fault detected by the bridging fault test pattern creation section 106 is an actually detectable bridging fault which propagates through the LSI. The bridging fault test pattern creation section 106 decides whether or not a bridging fault is detected only based on the bridging fault type and logical connection information of the circuit.

Therefore, a bridging fault judged as "detected" by the bridging fault test pattern creation section 106 may not be propagated (undetected) up to the output terminal of the LSI depending on a relationship between the bridging fault voltage and the logical threshold of the reception cell. Therefore, the detection accuracy can be used for an appropriate evaluation of the fault coverage of a test pattern.

A method of calculating detection accuracy when a logical value "1" of a signal in a fault-free state becomes a logical value "0" due to a bridging fault will be explained below. Here, the ratios of the frequencies of bridging fault voltages $V_{s1}$ to $V_{sn}$ of the input group 1 to input group n to all bridging fault voltages where a bridging fault of each adjacent wire pair can occur are assumed to be relative frequencies $fV_{s1}$ to $fV_{sn}$ (n is a natural number). Furthermore, suppose the ratio of the frequency of logical threshold greater than (or equal to) the bridging fault voltage $V_{Si}$ to the input logical thresholds $V_{TH1}$ to $V_{THm}$ of the reception cell of the bridging fault is assumed to be a relative frequency $fV_{THi}$ (m is a natural number). The detection accuracy $T_{DT}$ is calculated by the following expression.

$$T_{DT}=\Sigma_i\{fV_{si}\times(fV_{THi}/fV_{THall})\}/\Sigma_i fV_{si}$$

$\Sigma_i$ means the sum from i=1 to n. $fV_{THall}$ is the sum total of relative frequencies of logical thresholds of the reception cell.

Other detection accuracies are likewise calculated in such a case that a logical value "0" of a signal in a fault-free state becomes a logical value "1." For example, the ratio of the frequency of logical threshold smaller than (or equal to) the bridging fault voltage $V_{Si}$ may be used as the relative frequency $fV_{THi}$.

The bridging fault test pattern creation section 106 reads the detailed bridging fault list and converts it to a bridging fault list (e.g., FIG. 15) of a simple format that can be read by the ATPG tool 1061 included in the bridging fault test pattern creation section 106.

The ATPG tool 1061 reads this simple bridging fault list and creates a test pattern with the bridging fault type determined on bridging faults in each adjacent wire pair taken into consideration.

Since the bridging fault type determined by a relationship between the bridging fault voltage and the logical threshold of the input of the reception cell is used, a test pattern is created which accurately detects a bridging fault propagating through the LSI.

The bridging fault test pattern creation section 106 records as to whether or not a bridging fault in each adjacent wire pair included in the bridging fault list can be detected by a test pattern or under what input condition the bridging fault can be detected into a simple bridging fault list based on the connection information of the target LSI and creates part of the fault detection information.

The bridging fault test pattern creation section 106 records this in the detailed bridging fault list as a specific result and uses it as the final fault detection information. Therefore, the format of the fault detection information is the same as FIG. 14, for example.

This makes it possible to evaluate up to what resistance value each bridging fault has been detected using the created test pattern. In practical terms, it is difficult to generate a test pattern so as to detect all input combinations of each bridging fault.

Therefore, for example, a combination of inputs corresponding to a maximum detection limit resistance value is extracted from the bridging fault list beforehand and a primary test pattern is generated targeted at the bridging fault list first. A secondary test pattern may also be created by extracting a fault list including all the input combinations for the undetected fault.

The bridging fault test pattern creation section 106 preferably has a multi-detection function. The multi-detection function is the function of creating a test pattern for detecting bridging faults in the same adjacent wire pair using a plurality of patterns where a logical value of an input signal for the drive cell or reception cell has been changed.

When, for example, a bridging fault is detected N times with respect to the same adjacent wire pair, the probability that a bridging fault may be detected in the adjacent wire pair by a bridging fault detection test on the actual target LSI is "$1-\{1-(\text{detection accuracy } DT_{DT} \text{ in each pattern})\}^N$." That is, the greater the number of detections N, the higher is the possibility that a bridging fault may be detected by the bridging fault detection test.

Furthermore, when the detection accuracy $DT_{DT}$ in one pattern is high, bridging faults can be detected with fewer detections. Here, when the type of each bridging fault i is taken into consideration, the detection accuracy is $DT_{DT,type}$ and the probability that each bridging fault i may be detected is "$DTP(i, Ni)=1-\{1-(\text{detection accuracy } DT_{DT,type}(1) \text{ in first detection pattern})\} \times \{1-(\text{detection accuracy } DT_{DT,type}(2) \text{ in second detection pattern})\} \times \ldots \times \{1-(\text{detection accuracy } DT_{DT,type}(Ni) \text{ in Nith detection pattern})\}$."

The bridging fault coverage or the like calculation section 107 calculates a weighted bridging fault coverage, bridging fault residual ratio (more simply, total adjacent wiring length accompanying the undetected faults) or the like based on a signal name, type, corresponding adjacent wiring length, detection limit resistance value, short distance information of each bridging fault included in fault detection information and bridging fault occurrence rate information including a bridging fault resistance distribution stored in the bridging fault occurrence information area 206. Generally, the bridging fault resistance distribution monotonously decreases as R increases from R=0.

Figure 16:
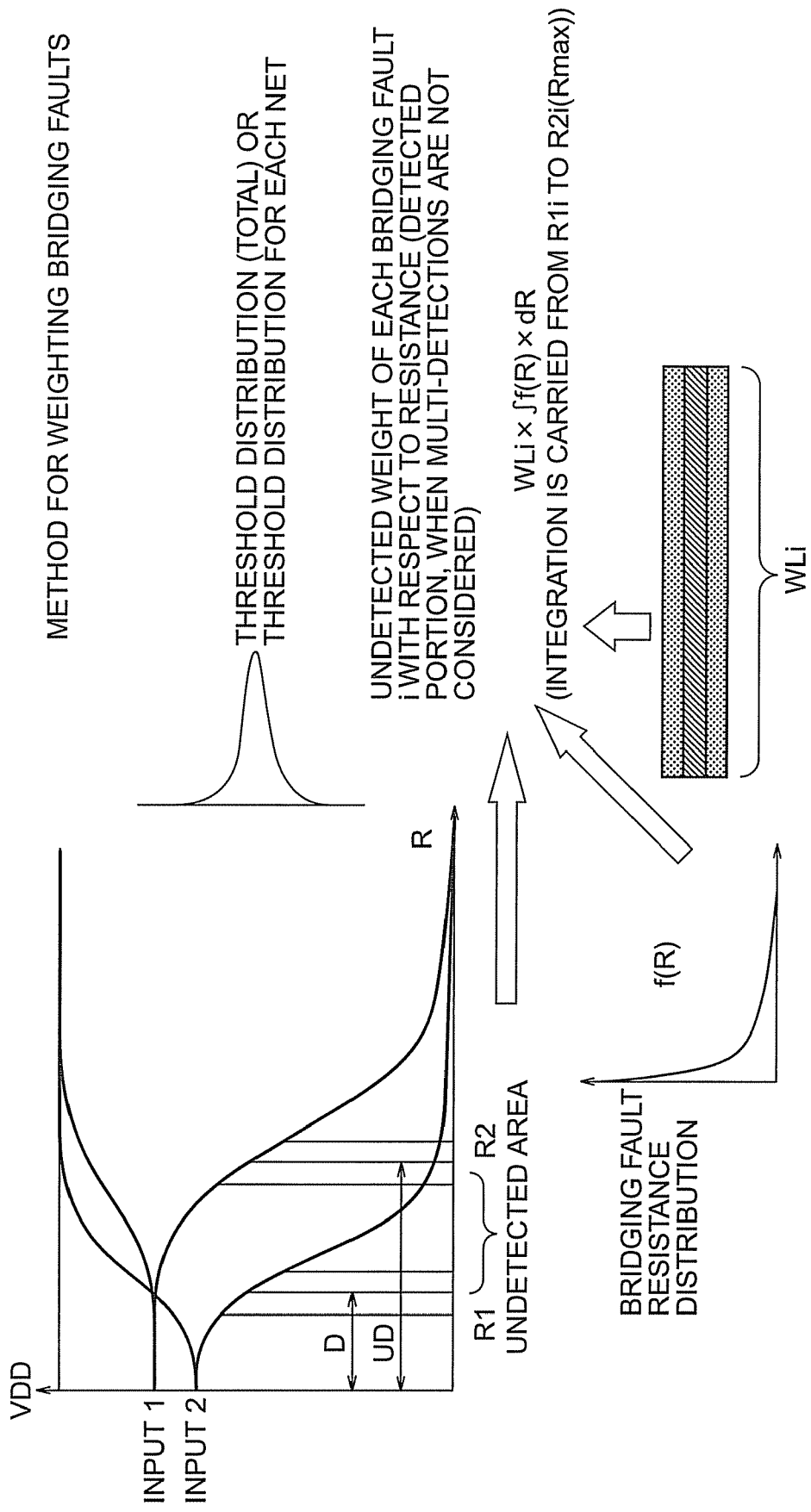
FIG. 16 illustrates a method of calculating a weighted fault coverage or the like according to the first embodiment of the present invention.

As shown in FIG. 16, as for each bridging fault, an undetected resistance area is generated according to the input when the bridging fault is detected, and therefore a fault coverage W_FC (Weighted_Fault-Coverage) weighted in consideration thereof is calculated using the following expression.

Here, suppose the detection probabilities of p bridging faults judged to have been detected by the bridging fault test pattern creation section 106 are DTP(1, N1) to DTP(p, Np) (N1 to Np are the number of bridging faults detected, p is a natural number).

Furthermore, suppose the adjacent wiring length is WLp, the total wiring length of bridging faults included in the bridging fault list is ADWL, the total wiring length of redundant faults is DDWL and the bridging fault resistance distribution (per unit wiring length) is f(R).

$\int_0^{R2k} f(R)dR$ is an occurrence rate of bridging fault k and R2k is a maximum detection limit resistance value that can be detected with fault k. The integral interval of f(R) of the numerator is 0 to R1k for each fault k and R1k is a maximum detection limit resistance value out of the input combinations detected with fault k. The redundant fault will be described later.

$$W\_FC = \Sigma_k WL_k \times \int_0^{R1k} f(R)dR \times DTP(k,Nk)/(ADWL-DDWL)$$

Where, $ADWL = \Sigma_i WL_i \times \int_0^{R2i} f(R)dR$ (i denotes all bridging faults of target LSI), $DDWL = \Sigma_j WL_j \times \int_0^{R2j} f(R)dR$ (j denotes all redundant faults of target LSI).

This makes it possible to calculate a weighted bridging fault coverage corresponding to a bridging fault occurrence rate estimated in an actual LSI with high accuracy. An undetected weight of each bridging fault k is calculated as $WL_k \times \int_{R1k}^{R2K} f(R)dR \times (1-DTP(k, Nk))$ for a detected one and calculated as $WL_k \times \int_0^{R2K} f(R)dR$ for an undetected one, and an overall (weighted) bridging fault residual ratio W_DL ((Weighted_) Defect-Level) can be calculated using the following expression. (An undetected resistance part is integrated about each fault i.) About an undetected fault, R1i=0, $DT_{DTi}=0$, Ni=0.

$$W\_DL = \Sigma_i WL_i \times \int_{R1i}^{R2i} f(R)dR \times \{1-DTP(i,Ni)\}$$

After generating a primary (or secondary) test pattern, it is possible to efficiently improve detection test quality of bridging faults by calculating a weight for each undetected bridging fault and adding a test pattern once again in descending order of weights.

Figure 17:
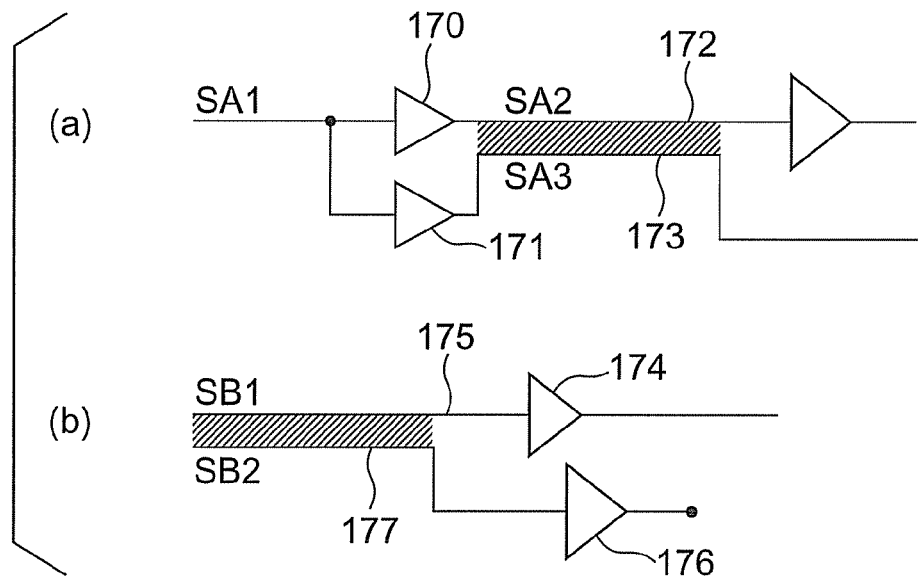
FIG. 17 shows an example of a redundant fault.

FIG. 17 shows an example of redundant fault. FIG. 17(*a*) shows signal SA1, buffer circuits 170 and 171 which transfer an inputted signal without level conversion, a wire 172 through which an output signal SA2 of the buffer circuit 170 propagates and a wire 173 through which an output signal SA3 of the buffer circuit 171 propagates. Since the signal SA2 and signal SA3 always have the same level value, it is not possible to detect any bridging fault between the wires 172 and 173.

FIG. 17(*b*) shows a wire 175 through which a signal SB1 inputted to a buffer circuit 174 propagates and a wire 177 through which a signal SB2 inputted to a buffer circuit 176 propagates. The output signal of the buffer circuit 176 does not propagate to any other circuit or is not outputted to the outside of the LSI either. Therefore, when there is the only possibility that an error signal of a bridging fault which occurs between the wires 175 and 177 may propagate via the buffer circuit 176, it is not possible to detect any bridging fault between the wire 175 and wire 177.

Figure 18:
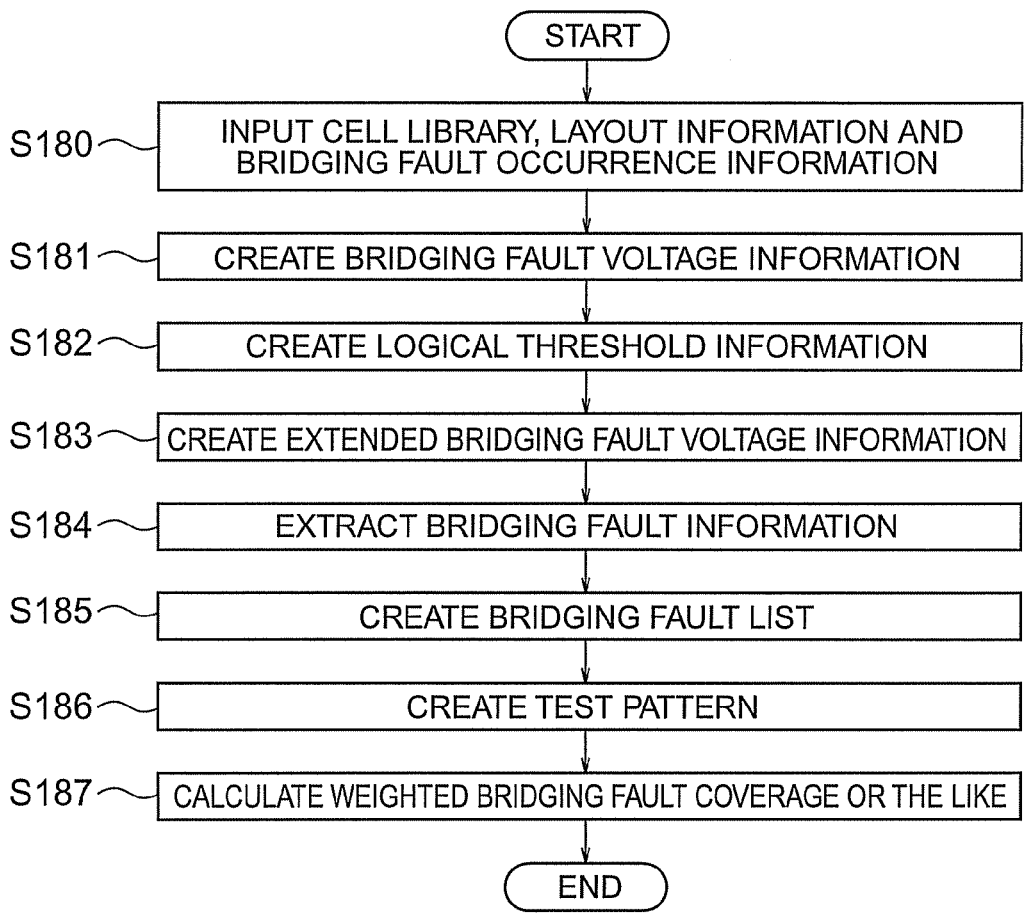
FIG. 18 is a flowchart illustrating a method of creating a test pattern and calculating a fault coverage or the like according to the first embodiment of the present invention.

The method of creating a test pattern and calculating a fault coverage according to this embodiment will be explained using the flowchart shown in FIG. 18.

(Step S180) A cell library used by a target LSI through the input apparatus 30 is stored in the cell library 201. Furthermore, the layout information on the target LSI is stored in the layout information area 204. Furthermore, a preset short distance is stored in the extraction condition area 205 and the bridging fault occurrence rate and bridging fault occurrence distribution information are stored in the bridging fault occurrence information area 206.

(Step S181) The bridging fault voltage calculation section 101 executes a circuit simulation, calculates a bridging fault voltage or the like at short-circuited points (suppose resistance between wires R=0) assumed between cell outputs, creates bridging fault voltage information and stores it in the bridging fault voltage library 202.

(Step S182) The logical threshold calculation section 102 executes a circuit simulation, calculates a logical threshold of each input of the cell, creates logical threshold information and stores it in the logical threshold library 203.

(Step S183) The detection limit resistance value calculation section 103 calculates a detection limit resistance value of each bridging fault based on the bridging fault voltage information and logical threshold information, adds the information on the detection limit resistance value to the bridging fault voltage information, creates extended bridging fault voltage information and stores it in the extended bridging fault voltage library 208.

Here, the extended bridging fault voltage library 208 may also add necessary information to the bridging fault voltage library 202. As explained before, the bridging fault voltage library 202 added with necessary information on the detection limit resistance may be regarded as the extended bridging fault voltage library.

(Step S184) The bridging fault information extraction section 104 extracts bridging fault information on adjacent wire pairs whose inter-wire distance is equal to or less than a short distance from among the plurality of adjacent wire pairs included in the layout information based on the layout information and extraction condition and stores the bridging fault information in the bridging fault information area 207.

(Step S185) The bridging fault list creation section 105 creates a bridging fault list based on the extended bridging fault voltage information, logical threshold information and bridging fault information and stores the bridging fault list in the bridging fault list area 209.

(Step S186) The test pattern creation section 106 reads the bridging fault list and the ATPG tool 1061 creates part of the test pattern and fault detection information for detecting bridging faults on the adjacent wire pairs included in the bridging fault list. The test pattern creation section 106 writes part of the fault detection information into the bridging fault list and uses it as fault detection information. The fault detection information is stored in the fault detection information area 210.

(Step S187) The bridging fault coverage calculation section 107 reads the fault detection information, bridging fault occurrence rate and occurrence distribution information and calculates a fault coverage W_FC of the test pattern, undetected weight of each bridging fault and bridging fault residual ratio W_DL or the like. The calculated fault coverage or the like is stored in the weighted fault coverage or the like area 211. Furthermore, an undetected fault dictionary obtained by sorting undetected faults in descending order of weights is also stored in the weighted fault coverage or the like area 211.

In this way, since the detection limit resistance value Rc of a resistive (R>0) bridging fault is calculated based on the bridging fault voltage information created when the inter-wire resistance R=0, it is possible to realize a high degree of accuracy when R=0 and evaluate the influences of R>0 with practically sufficient accuracy and at high speed.

Furthermore, since the bridging fault coverage is calculated based on detailed wiring information, it is possible to predict a fault coverage at an actual product shipment test and a bridging fault occurrence rate (<bridging fault residual ratio) in the market with high accuracy and effectively create a test pattern and improve test quality.

Second Embodiment

Figure 19:
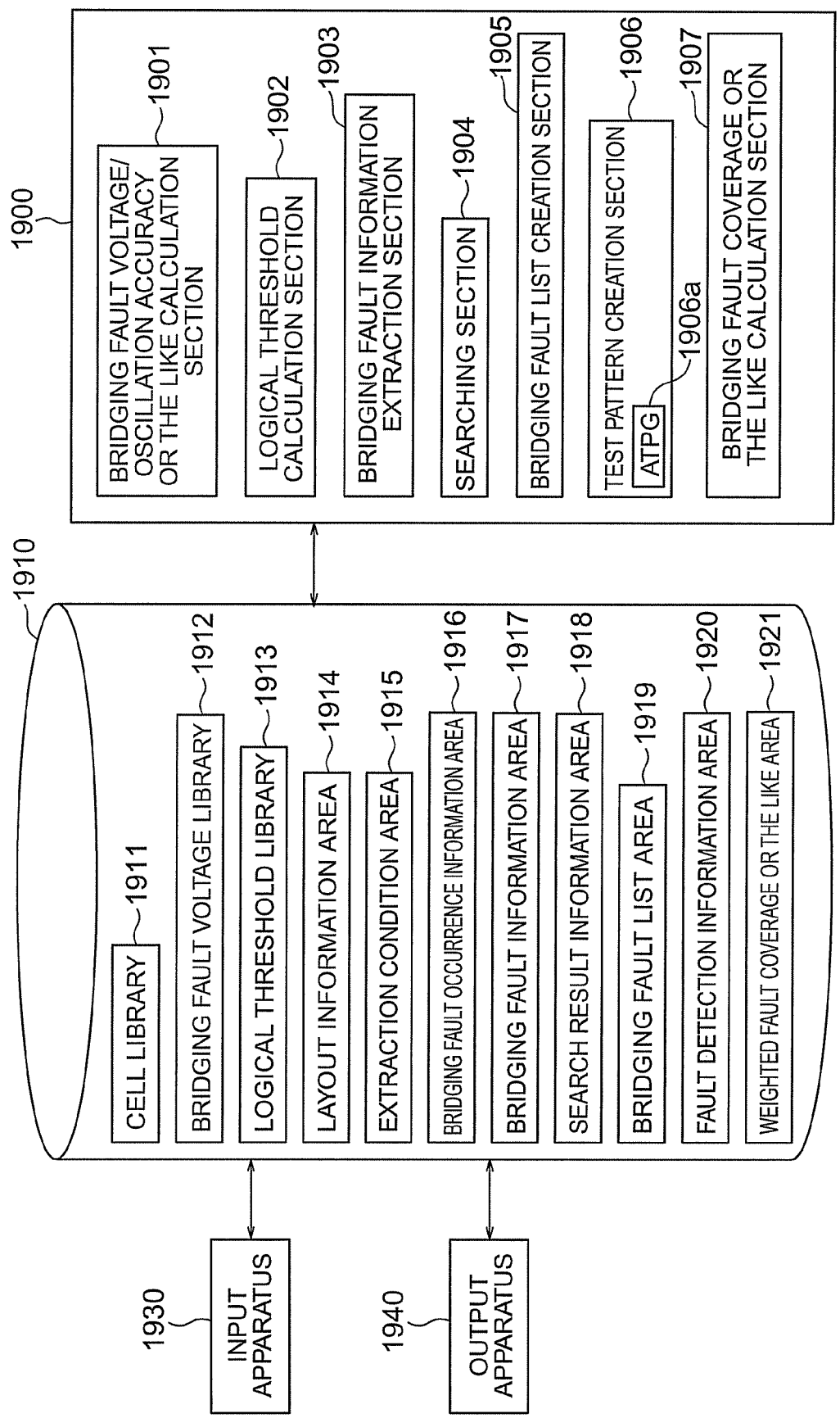
FIG. 19 shows a schematic configuration of an apparatus for creating a test pattern and calculating a fault coverage or the like according to a second embodiment of the present invention.

FIG. 19 shows a schematic configuration of an apparatus for creating a test pattern and calculating a fault coverage or the like according to a second embodiment of the present invention.

A bridging fault voltage/oscillation accuracy or the like calculation section 1901 calculates a voltage of a short-circuited point assumed on an arbitrary output terminal of a plurality of cells. A logical threshold calculation section 1902 calculates logical thresholds of input terminals of a plurality of cells and creates logical threshold information.

A bridging fault information extraction section 1903 extracts bridging fault information including signal information on an adjacent wire pair whose inter-wire distance is within a predetermined short distance range and information on a drive cell or the like.

A searching section 1904 detects whether or not the bridging fault pair included in the bridging fault information is a feedback fault. A bridging fault list creation section 1905 creates a bridging fault list using the bridging fault information, logical threshold information and bridging fault voltage information.

A bridging fault test pattern creation section 1906 creates a test pattern to detect a bridging fault at the adjacent wire pair using the bridging fault list or executes a fault simulation using this test pattern, writes information including input information of each detected bridging fault into the bridging fault list and creates bridging fault detection information.

A bridging fault coverage or the like calculation section 1907 calculates a weighted bridging fault coverage, bridging fault residual ratio or the like based on information inputted to the cell which drives each bridging fault and information included in the bridging fault list.

The bridging fault voltage/oscillation accuracy calculation section 1901, logical threshold calculation section 1902, bridging fault information extraction section 1903, searching section 1904, bridging fault list creation section 1905, bridging fault test pattern creation section 1906, and bridging fault coverage or the like calculation section 1907 are included in a central processing unit 1900.

The apparatus for creating a test pattern and calculating a fault coverage or the like is further provided with a storage 1910, an input apparatus 1930 and an output apparatus 1940.

The storage 1910 is provided with a cell library 1911, a bridging fault voltage library 1912, a logical threshold library 1913, a layout information area 1914, an extraction condition area 1915, a bridging fault occurrence information area 1916, a bridging fault information area 1917, a search result information area 1918, a bridging fault list area 1919, a fault detection information area 1920, and a weighted fault coverage or the like area 1921.

The cell library 1911 stores an ATPG/fault simulation model of a cell and a circuit simulation model of the cell. The bridging fault voltage library 1912 stores bridging fault voltages of respective bridging faults between outputs of two cells, supply current information and oscillation accuracy or the like. The logical threshold library 1913 stores logical threshold information on an input terminal of each cell.

The layout information area 1914 stores layout information on a target LSI. The extraction condition area 1915 stores a preset short distance. The bridging fault occurrence information area 1916 stores bridging fault occurrence rate information including a bridging fault occurrence distribution by adjacent distance.

The bridging fault information area 1917 stores the bridging fault information extracted from the layout information. The search result information area 1918 stores search result information.

The bridging fault list area 1919 stores the bridging fault list. The fault detection information area 1920 stores the fault detection information. The weighted fault coverage area 1921 stores a weighted fault coverage of a test pattern for a bridging fault detection test and bridging fault residual ratio or the like.

An input apparatus 1930 is a keyboard, mouse, hard disk drive (including also portable type) and a reader for a portable type external storage medium such as CD-ROM, DVD, USB memory.

An output apparatus 1940 is a display, printer, external storage, external storage including central processing unit 1900 connected via a network, hard disk drive apparatus (including also portable type) and a writer for a portable type external storage medium such as CD-ROM, DVD, USB memory.

Figure 20:
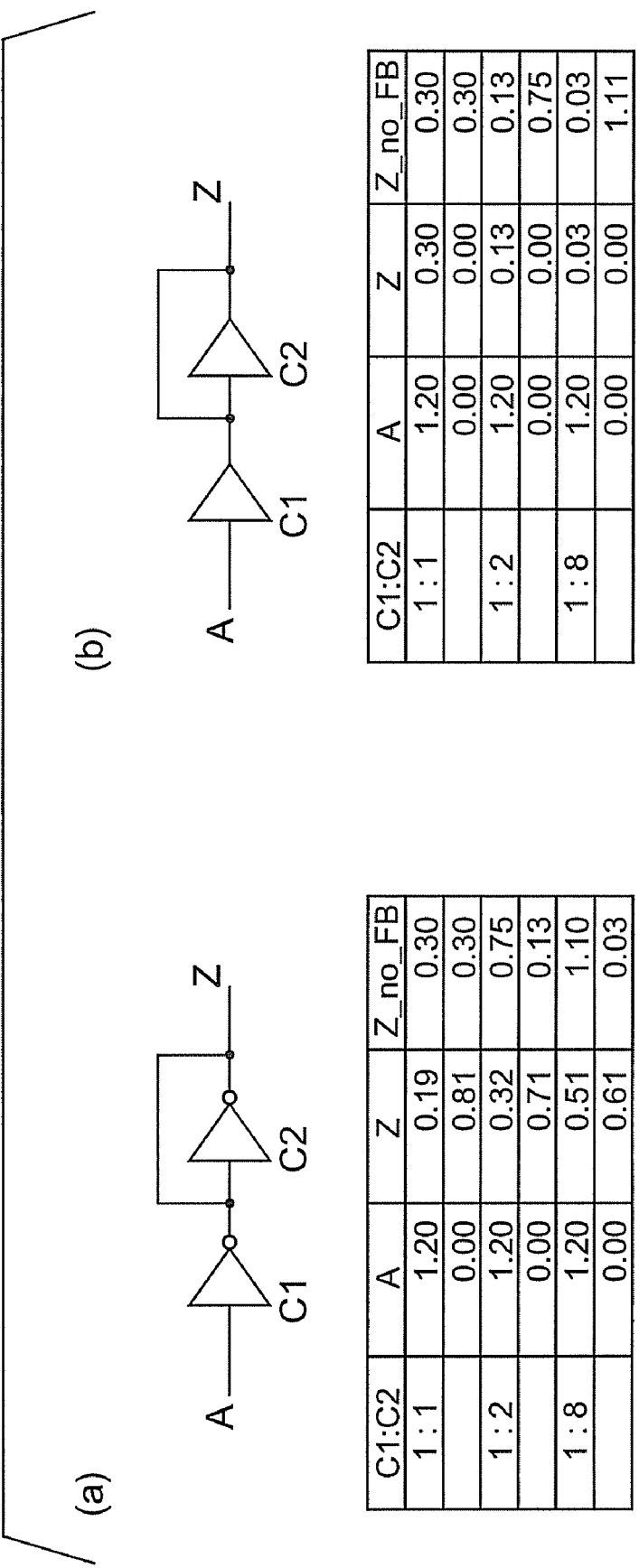
FIG. 20 shows an example of a feedback bridging fault.

The feedback bridging fault will be explained using FIG. 20. FIG. 20 shows an example where the input and output of a cell C2 are short-circuited (feedback bridging fault), FIG. 20(*a*) shows the voltages of a signal A inputted to a cell C1 when inverted signals are short-circuited and a signal Z outputted from the cell C2, while FIG. 20(*b*) shows the voltages of a signal A inputted to the cell C1 when non-inverted signals are short-circuited and a signal Z outputted from the cell C2. Furthermore, "Z_no_FB" indicates no feedback, that is, a voltage of the signal Z in the case of a bridging fault by mutually independent inputs. "C1:C2" indicates the ratio in gate width between the cells C1 and C2.

FIG. 20(*a*) is somewhat a special example (feedback to the same logical gate) and it is apparent that when a feedback bridging fault occurs between inverted signals, no oscillation occurs and stability is achieved at an intermediate voltage.

Furthermore, it is apparent from FIG. 20(*b*) (two normal inverter gates are cascaded) that even between non-inverted signals input values are not buffered as they are and stability is achieved at an intermediate voltage.

Furthermore, it is also apparent that values are considerably different from the bridging fault (Z_no_FB) caused by mutually independent inputs. A general feedback bridging fault is configured by the output of one cell being short-circuited with the output of the other cell which influences the input of the same cell via at least one logical gate, but this is different from the above described example where an input and output of the same cell (logical gate) are short-circuited and the bridging fault voltage itself is the same as the case where there is no such influence.

It should be noted that even when the input and output of the same cell are short-circuited, if a logical gate corresponding to the above described case is included inside, it constitutes a general feedback bridging fault.

The bridging fault voltage/oscillation accuracy calculation section 1901 targets at all combinations of drive cells that can drive wire pairs and calculates the voltages of short-circuited (bridging) points assumed on the wire pairs in consideration of logical values of two arbitrary output signals of a plurality of drive cells and logical values of input signals of the drive cells or the like through a circuit simulation.

The bridging fault voltage/oscillation accuracy calculation section 1901 reads a circuit description for a circuit simulation of the cell and an operation model for a circuit simulation of elements used in the circuit description from the cell library 1911 and creates a net list for a circuit simulation where two arbitrary cell outputs are short-circuited via a resistor R. The net list created includes a net list where two outputs of the same cell are short-circuited and a net list where one output and one input of the same cell are short-circuited.

The bridging fault voltage/oscillation accuracy calculation section 1901 executes a circuit simulation with all possible combinations of inputs about the created net list.

The bridging fault voltage/oscillation accuracy calculation section 1901 extracts information on the basic oscillation accuracy and signal holding accuracy or the like set in consideration of a voltage of a short-circuited point (bridging fault voltage), bridging fault current, degree of combination and feedback bridging fault from the execution result of the circuit simulation and stores the information in the bridging fault voltage library 1912 as the bridging fault voltage library.

When two arbitrary cell outputs are short-circuited, the bridging fault voltage library is created by differentiating a case where an output of a cell made up of one logical gate influences an input of the same cell ("self" or "direct" feedback bridging fault) from a case where the output of the cell does not influence.

FIG. 21 shows a format example of the bridging fault voltage library. Since it is possible to use the same information except oscillation accuracy or signal holding accuracy for any bridging faults other than self feedback bridging faults, whether general feedback bridging faults or not, "basic oscillation/signal holding accuracy" is added as information and information on a self feedback bridging fault is additionally described in "/01 SFB, /10 SFB" which is provided separately.

With regard to a feedback fault, a signal for doing input to a feedback loop (or signal for feedback output) needs to be specified and an item "signal No. for doing input to feedback loop" is provided. Suppose signal No. is "1" in the case of a signal A and "2" in the case of a signal B. When the same cell drives the signals A and B, a case where the signal A does input to the feedback loop is expressed.

Furthermore, as shown in FIG. 19, a self feedback bridging fault may behave not like a bridging fault but like a pseudo-0 stuck-at fault (specified as PSAO: Pseudo Stuck-At 0), for example, and therefore the item "type of special fault" specifies this. Furthermore, a general feedback bridging fault may produce oscillation (fault), and therefore oscillation is expressed as "OSC."

The item "basic oscillation/signal holding fault occurrence accuracy" is basically determined by whether the number of signal inversions included the in feedback loop is an even or odd number and by the driving force of the cell that drives the bridging fault. The former is searched and extracted by the searching section 1904. In the latter case, when the number of signal inversions is an odd number, an oscillation occurs when the driving force of the cell positioned backward (doing feedback output) is greater than the driving force of the forward cell (doing input to feedback loop). Therefore, simply stated, it is possible to assume in correspondence with a combination of respective signals of each bridging fault:

If driving force of forward cell output<driving force of backward cell output, basic oscillation accuracy=1

If driving force of forward cell output>driving force of backward cell output, basic oscillation accuracy=0

Since the comparison result of the driving forces is reflected in the bridging fault voltage, those described above can be classified in association with the bridging fault voltage or further the bridging fault type.

When input information at the time of detection of a bridging fault can be acquired, the basic oscillation accuracy may be assumed to be the oscillation accuracy of the bridging fault. When the input information at the time of detection of a bridging fault cannot be acquired, the basic oscillation accuracy of each input combination weighted with the frequency may be assumed to be the oscillation accuracy of the bridging fault.

When no oscillation occurs, the bridging fault behaves as a normal Aggressor-Victim type bridging fault.

When the number of signal inversions is an even number, signal holding (Hold, normally 0) may occur, and this occurs, as in the case of oscillation, when the driving force of the cell positioned backward (doing feedback output) is greater than the driving force of the forward cell (doing input to feedback loop). Therefore, simply, suppose the same item as the basic oscillation accuracy is used as the basic oscillation accuracy for the combination of the respective signals of each bridging fault so that:

if driving force of forward cell output<driving force of backward cell output, basic signal holding accuracy=1 and if driving force of forward cell output>driving force of backward cell output, basic signal holding accuracy=0.

When no signal holding occurs, the bridging fault behaves as a normal Aggressor-Victim type bridging fault.

In a self feedback bridging fault, the forward (doing input to feedback loop) cell always becomes the bridging fault behaving as the Aggressor without depending on the driving force of the backward positioned (doing feedback output) cell or the driving force of the forward (doing input to feedback loop) cell.

Therefore, "F0/F1" (when A signal becomes the forward cell) is entered as the item "type of special fault." Furthermore, simply stated, assuming that the same item as the basic oscillation/signal holding accuracy is used as the same bridging fault occurrence accuracy, "forward cell Aggressor bridging fault occurrence accuracy=1" always holds. Such an accuracy item may be deleted, but should be left as is to secure symmetry of the expression when the weighted bridging fault coverage is calculated.

The logical threshold calculation section 1902 executes a circuit simulation while changing the input voltage of a one arbitrary input of each input group of the cell, calculates the input voltage (logical threshold) when the logical value of the output changes and creates logical threshold information.

The bridging fault information extraction section 1903 extracts bridging fault information on the adjacent wire pair within a short distance range included in the extraction condition area 1915 from the layout information of the target LSI stored in the layout information area 1914.

The searching section 1904 traces one signal of each bridging fault pair included in the bridging fault information back to the input of the LSI or the output of a flip flop that can be scanned. The searching section 1904 then detects whether the other signal is included in the signal inputted to an instance (cell) that outputs this signal or a signal connected to the input signal.

When the other signal is included, the searching section 1904 detects whether the number of logical gates until the one signal reaches the cell that outputs the other signal is 1 (self feedback bridging fault) or not or whether the number of signal inversions is an odd number or even number.

With regard to a search, when a feedback bridging fault is detected in a search of the one signal, the search ends on the bridging fault, but when any feedback bridging fault is not detected, a search is also performed on the other signal. The search result is stored in the search result information area 1918 as search result information.

FIG. 22 shows a format example of the search result information. "<signal A>" "<signal B>" may also be "<A signal drive basic cell instance name> <basic cell name>, <output terminal name>", "<B signal drive basic cell instance name> <basic cell name>, <output terminal name>."

Suppose "search source signal No when feedback is detected" is "1" for the signal A and "2" for the signal B. "Whether the number of signal inversions included in feedback loop is even or odd" is expressed, for example, as "ODD" (odd number) or "EVEN" (even number).

The above described search may also be performed by tracing the one signal of each bridging fault pair forward to the output side. It is generally possible to efficiently detect the presence or absence of a feedback bridging fault through forward tracing when the signal from which the search is started is close to the input of the LSI or the output of a flip flop that can be scanned, or through backward tracing when the signal from which the search is started is close to the output of the LSI or the input of the flip flop that can be scanned.

Therefore, after simply confirming the position of each signal (e.g., the number of logical stages from the flip flop output that can be scanned/average number of logical stages between flip flops that can be scanned) at the start of a search, a tracing method which is judged to be capable of providing an efficient search may be selected.

Figure 23:
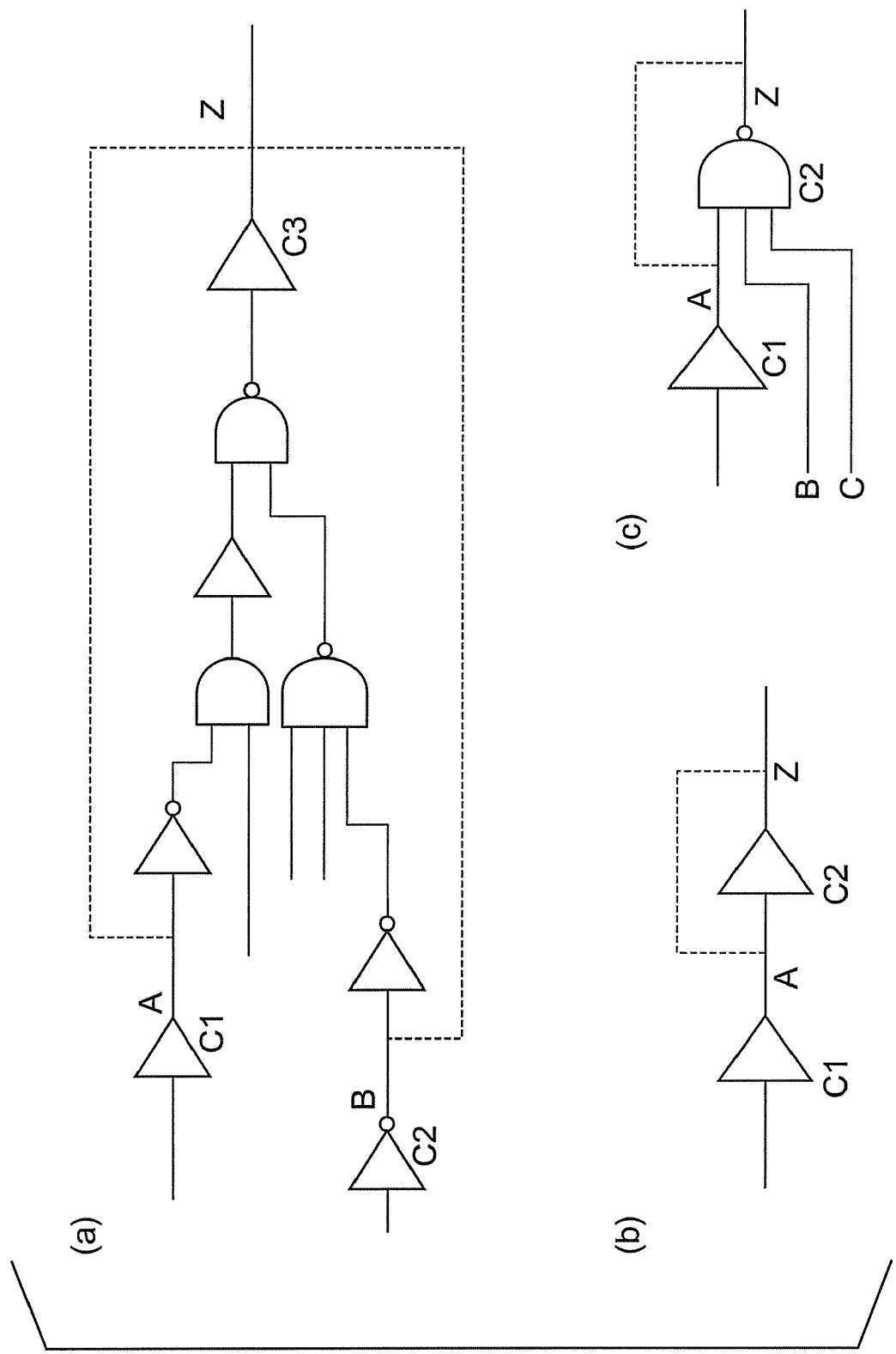
FIG. 23 is an example of a feedback bridging fault.

FIG. 23 shows search examples for a feedback bridging fault. In the example shown in FIG. 23(*a*), signals A and Z, and signals B and Z constitute bridging faults and signal A or B is reached by tracing from the signal Z back to the input side. In this case, the number of logical gates that invert signals is counted and it is judged whether the number is an odd number or even number.

Furthermore, the oscillation/signal holding accuracies of the drive cells C1 and C3 of the signal A, Z and the drive cells C2 and C3 of the signals B and Z which are feedback bridging faults are determined by whether the number of signal inversions is an even number or odd number and the driving force of the cell that drives the bridging fault and does not depend on the number of logical gates between the drive cells unless the number of gates is considerably large.

When the logical path of a logical gate that inverts the signal such as signals B and Z is activated, it is estimated that oscillation within a predetermined voltage range may occur according to the oscillation accuracy. An oscillation occurs when the driving force of the backward positioned (doing feedback output) cell is greater than the driving force of the forward (doing input to feedback loop) cell. Otherwise, a normal Aggressor-Victim type bridging fault results.

When the number of logical gates that invert a signal is an even number such as the signals A and Z, if the driving force of the backward positioned (doing feedback output) cell is greater than the driving force of the forward (doing input to feedback loop) cell, the signal A is held (normally 0) and a normal Aggressor-Victim type bridging fault results otherwise.

In the example shown in FIG. 23(*b*), an output signal A of a cell C1 is connected to an input of a cell C2 made up of one logical gate and an output signal Z of the cell C2 and the signal A together form a bridging fault. In this case, no oscillation occurs as shown in FIG. 19 and the voltage thereof converges to an intermediate voltage. The fault does not depend on the driving forces of the output signals of the cells C1 and C2 and becomes a bridging fault whereby the signal A connected to the output terminal of the cell C1 behaves as an Aggressor.

The example shown in FIG. 23(c) is a generalized version of the example shown in FIG. 23(b) and has a voltage which is different from the bridging fault voltage determined by mutually independent inputs only when there is a possibility that signal A inputted to the cell C2 (output signal of the cell C1) may take an intermediate voltage depending on the input to the cell C2 (that is, B=1 and C=1). As the fault, the signal A behaves as an Aggressor as in the case of FIG. 23(b).

The bridging fault list creation section 1905 creates a detailed bridging fault list based on the bridging fault information, logical threshold information, bridging fault voltage information and search result information. FIG. 24 shows a format example of the bridging fault list.

The items "A(B) signal drive cell input value" and "detection information" are the same as those in FIG. 14. Furthermore, the item "signal No. for doing input to feedback loop" is the same as that in FIG. 21. The item "bridging fault type/special fault type" describes the type of fault including general bridging fault and oscillation or the like and F0, F1, S0, S1, and OSC, PSA0, F0/F1 of a general bridging fault are written. These types also reflect various types of configuration of feedback bridging faults.

The definition of "(total) detection accuracy" is the same as that in FIG. 14, but the case of a feedback bridging fault is slightly different and will therefore be explained. Here, suppose the ratio in frequency of bridging fault voltages $V_{S1}$ to $V_{Sn}$ of input group 1 to input group n to all possible bridging fault voltages of bridging faults of each adjacent wire pair are relative frequencies $fV_{S1}$ to $fV_{Sn}$ (n is a natural number).

In the feedback bridging fault, the probability of occurrence P1 of oscillation/holding/forward cell Aggressor fault is described in the bridging fault library for each group i, and therefore detection accuracy $DT_{DT}$ is calculated using this value according to the following expression.

$$DT_{DT} = \Sigma i \{fV_{Si} \times Pi\} / \Sigma_j fV_{Si}, \text{ where } \Sigma_i \text{ is the sum from } i=1 \text{ to } n$$

The test pattern creation section 1906 creates a simple bridging fault list that an ATPG tool 1906a included in the test pattern creation section 1906 can read from the detailed bridging fault list. The ATPG tool 1906a reads this simple bridging fault list and creates a test pattern in consideration of a bridging fault type determined for each bridging fault of each adjacent wire pair.

FIG. 25 shows a format example of the simple bridging fault list. Suppose the ATPG tool 1906a also has the function of detecting faults in special modes accompanying the feedback bridging faults. Detecting faults in the special modes is easier than detecting general bridging faults and can be supported by extending a general bridging fault detection program.

The bridging fault test pattern creation section 1906 records as to whether or not a bridging fault with each adjacent wire pair included in the simple bridging fault list can be detected by a test pattern and under which input condition the bridging fault is detected based on the connection information of the target LSI and creates part of the fault detection information.

The bridging fault test pattern creation section 1906 writes this information into the detailed bridging fault list as a specific result and uses the result as the final fault detection information. Therefore, the format of the fault detection information is the same as, for example, that in FIG. 24.

The bridging fault coverage calculation section 1907 calculates the weighted bridging fault coverage, bridging fault residual ratio or the like in consideration of the feedback bridging fault and multiple detections based on the corresponding adjacent wiring length, short distance information or the like included in the fault detection information. A weighted bridging fault coverage W_FC can be calculated according to the following expression.

$$W\_FC = \Sigma_k WL_k \times DTP(k,Nk)/(ADWL-DDWL)$$

where, $ADWL=\Sigma_i WL_i$ (i is total bridging fault of target LSI), $DDWL=\Sigma_j WL_j$ (j is total redundant fault of target LSI).

Furthermore, when the type/special fault type of each bridging fault i is also taken into consideration, the detection accuracy is $DT_{DT,type}$ (special fault is also included in "type") and the probability that each bridging fault i is detected becomes "DTP(i, Ni)=1-{1-(detection accuracy in first detection pattern $DT_{DT,type}(1)$)}×{1-(detection accuracy in second detection pattern $DT_{DT,type}(2)$)}× . . . ×{1-(detection accuracy in Nith detection pattern $DT_{DT,type}(Ni)$)}."

Suppose the detection probabilities of p bridging faults judged to have been detected by the bridging fault test pattern creation section 1906 are DTP(1, N1) to DTP(p, Np) (suppose "N1 to Np" are the number of bridging faults detected, "p" is a natural number). Furthermore, suppose the adjacent wiring length is "WLp," the total wiring length of bridging faults included in the bridging fault list is "ADWL," the total wiring length of redundant faults is "DDWL," and the bridging fault occurrence rate (per unit wiring length) is "f."

The above described expression allows a weighted bridging fault coverage corresponding to the bridging fault occurrence rate estimated in the actual LSI to be obtained with high accuracy. The undetected weight of each bridging fault k is calculated as $f \times WL_k \times \{1-DTP(k, Nk)\}$ and the total bridging fault residual ratio W_DL((Weighted_) Defect-Level) can be calculated by the following expression.

$$W\_DL = f \times \Sigma_i WL_i \times \{1-DTP(i,Ni)\}$$

Figure 26:
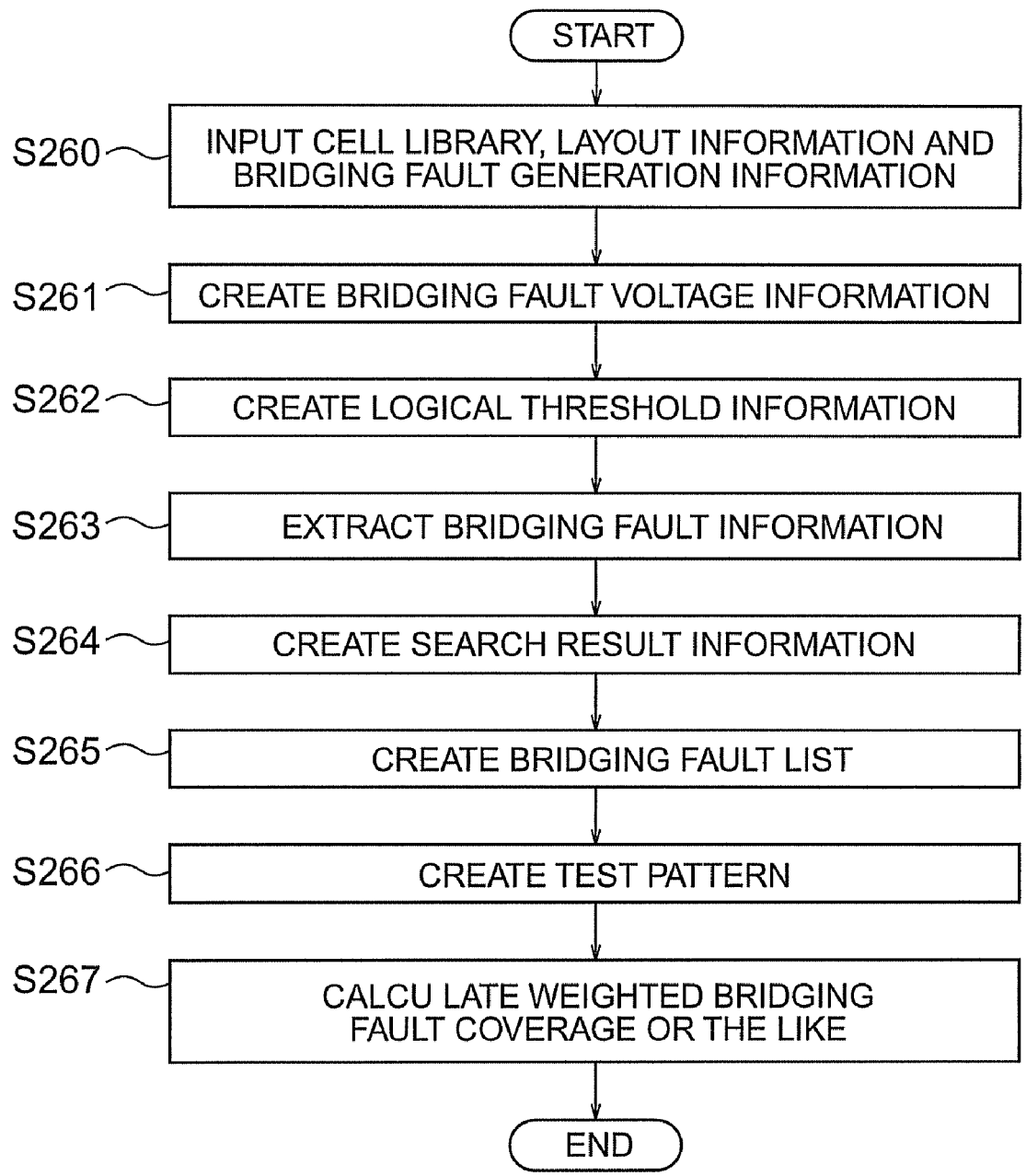
FIG. 26 is a flowchart illustrating a method of creating a test pattern and calculating a fault coverage or the like according to the second embodiment of the present invention.

The test pattern creation and fault coverage method according to this embodiment will be explained using the flowchart shown in FIG. 26.

(Step S260) The cell library used in the target LSI is stored in the cell library 201 through the input apparatus 1930. Furthermore, the layout information on the target LSI is stored in the layout information area 1914. Furthermore, a preset short distance is stored in the extraction condition area 1915 and the bridging fault occurrence rate and bridging fault occurrence distribution information are stored in the bridging fault occurrence information area 1916.

(Step S261) The bridging fault voltage/oscillation accuracy calculation section 1901 executes a circuit simulation, calculates bridging fault voltages or the like at short-circuited points assumed between cell outputs (suppose inter-Wire resistance R=0) when both outputs are independent of each other and when the output of a cell made up of one logical gate has an effect on the input of the same cell ("self" or "direct" feedback bridging fault) respectively, creates bridging fault voltage information and stores the bridging fault voltage information in the bridging fault voltage library 1912.

(Step S262) The logical threshold calculation section 1902 executes a circuit simulation, calculates a logical threshold of each input of the cell, creates logical threshold information and stores the logical threshold information in the logical threshold library 1913.

(Step S263) The bridging fault information extraction section 1903 extracts bridging fault information on an adjacent wire pair whose inter-wire distance is equal to or less than a short distance from among a plurality of adjacent wire pairs included in the layout information based on the layout information and extraction condition and stores the bridging fault information in the bridging fault information area 1917.

(Step S264) The searching section 1904 detects whether or not the bridging fault pair included in the bridging fault information is a feedback fault, creates search result information and stores the search result information in the search result information area 1918.

(Step S265) The bridging fault list creation section 1905 creates a bridging fault list including a special fault accompanying the feedback bridging fault based on the bridging fault voltage information, logical threshold information, bridging fault information and search result information and stores the bridging fault list in the bridging fault list area 1919.

(Step S266) The test pattern creation section 1906 reads the bridging fault list and the ATPG tool 1906a creates a test pattern for detecting bridging faults in the adjacent wire pair included in the bridging fault list and part of the fault detection information. The test pattern creation section 1906 writes part of the fault detection information into the bridging fault list and uses it as fault detection information. The fault detection information is stored in the fault detection information area 1920.

(Step S267) The bridging fault coverage or the like calculation section 1909 reads the bridging fault list and the bridging fault occurrence rate information and calculates a fault coverage of the test pattern, undetected weight of each bridging fault, bridging fault residual ratio or the like. The calculated fault coverage W_FC or the like is stored in the weighted fault coverage or the like area 1921. Furthermore, the undetected fault library sorted in descending order of weights of undetected faults is also stored in the weighted fault coverage or the like area 1921.

In this way, it is possible to extract bridging faults incorporating circuit simulation results of the basic cell base in consideration of the product layout information and even feedback bridging faults in an appropriate form, classify the fault type with high accuracy and also estimate the influences of feedback bridging faults within a practical range.

Furthermore, since the bridging fault coverage, bridging fault residual ratio or the like are calculated based on detailed information of wires, it is possible to predict the fault coverage and bridging fault occurrence rate in actual product shipment tests with high accuracy, create an effective test pattern and improve test quality.

All the above described embodiments are presented by way of example and should not be considered as limitative. The test pattern creation sections 106 and 1906 create an execution report including execution logs on test pattern creation and fault simulation, the number of test patterns, total fault coverage or fault coverage by bridging fault type (may also include special faults accompanying feedback bridging fault), number of detected faults, number of undetected faults, number of redundant faults or the like obtained through an ATPG and fault simulation and stores the execution report in an execution result report area (not shown).

Furthermore, test patterns created by the test pattern creation sections 106 and 1906 can be stored in a test pattern area (not shown).

What is claimed is:

1. An apparatus for creating a test pattern and calculating a fault coverage, and bridge fault residual ratio or simply total adjacent wiring length of undetected bridge faults, comprising:

a bridging fault voltage calculation section that creates bridging fault voltage information indicating a relationship between logical values of input signals of a plurality of cells and voltages of bridging points assumed on the wires derived from output terminals of the plurality of cells and including supply current value information;

a logical threshold calculation section that creates logical threshold information by calculating logical thresholds of input terminals of the plurality of cells;

a bridging fault information extraction section that extracts bridging fault information including signal information on an adjacent wire pair whose inter-wire distance is within a predetermined short distance range where bridge faults occur with a probability, a wiring length of the adjacent wire pair, information on an input terminal of a drive cell that drives the adjacent wire pair and information on an input terminal of a reception cell to which a signal propagating to the adjacent wire pair is inputted, from layout information of a semiconductor integrated circuit;

a detection limit resistance value calculation section that calculates a detection limit resistance value based on a voltage of the bridging point included in the bridging fault voltage information and the supply current value information and a distribution of logical thresholds of a cell included in the logical threshold information and to which the bridging point is connected, adds information on the detection limit resistance value to the bridging fault voltage information and creates extended bridging fault voltage information;

a bridging fault list creation section that creates a bridging fault list including a bridging fault type determined by a relationship between a voltage of the bridging point and logical threshold of the input terminal of the reception cell using the bridging fault information, the logical threshold information and the extended bridging fault voltage information;

a test pattern creation section that creates a test pattern for detecting bridging faults in the adjacent wire pair using the bridging fault list, judges whether the bridging faults included in the bridging fault list can be detected according to the test pattern and creates fault detection information; and a fault coverage calculation section that calculates a bridging fault coverage and a bridging fault residual ratio of the test pattern weighted with an integral value of a bridging fault resistance value distribution in a detection resistance area according to the test pattern based on the detection limit resistance value and the wiring length using bridging fault occurrence rate information including the fault detection information and bridging fault resistance value distribution information.

2. The apparatus according to claim 1, wherein the detection limit resistance value calculation section calculates the detection limit resistance value with respect to voltages corresponding to a base and peaks or a voltage corresponding to a mean value of a logical threshold distribution of a cell to which the bridging point is connected.

3. The apparatus according to claim 1, wherein the bridging fault voltage calculation section creates the bridging fault voltage information on only a cell included in a bridging fault detection target circuit.

4. The apparatus according to claim 1, wherein the bridging fault voltage calculation section performs grouping based on a combination of inputs of the cell and creates the bridging fault voltage information including a frequency of input indicating the number of combinations of each group.

5. The apparatus according to claim 1, wherein the logical threshold calculation section changes an input voltage of an arbitrary input of each cell by a predetermined unit and calculates the input voltage when an output logical value changes as the logical threshold.

6. The apparatus according to claim 5, wherein the logical threshold calculation section calculates, if a first input voltage at which the output logical value changes when an input logical value is changed from 1 to 0 is different from a second input voltage at which the output logical value changes when the input logical value is changed from 0 to 1, a mean value of the first input voltage and the second input voltage as the logical threshold.

7. The apparatus according to claim 1, wherein the drive cell and the reception cell are included in the plurality of cells.

8. A method for creating a test pattern and calculating a fault, and bridge fault residual ratio or simply total adjacent wiring length of undetected bridge faults, comprising:
creating bridging fault voltage information indicating a relationship between logical values of input signals of a plurality of cells and voltages of bridging points assumed on the wires derived from output terminals of the plurality of cells and including supply current value information;
creating logical threshold information by calculating logical thresholds of input terminals of the plurality of cells;
extracting bridging fault information including signal information on an adjacent wire pair whose inter-wire distance is within a predetermined short distance range where bridge faults occur with a probability, a wiring length of the adjacent wire pair, input information on a drive cell that drives the adjacent wire pair and input information on a reception cell to which a signal propagating to the adjacent wire pair is inputted, from layout information of a semiconductor integrated circuit;
calculating a detection limit resistance value based on a voltage of the bridging point included in the bridging fault voltage information and the supply current value information and a distribution of logical thresholds of a cell included in the logical threshold information and to which the bridging point is connected, adding information on the detection limit resistance value to the bridging fault voltage information and creating extended bridging fault voltage information;
creating a bridging fault list including a bridging fault type determined by a relationship between a voltage of the bridging point and logical threshold of the input terminal of the reception cell using the bridging fault information, the logical threshold information and the extended bridging fault voltage information;
creating a test pattern for detecting bridging faults in the adjacent wire pair and bridging fault type using the bridging fault list, judging whether the bridging faults included in the bridging fault list can be detected according to the test pattern and creating fault detection information; and
using a processor for calculating the bridging fault coverage and bridging fault residual ratio of the test pattern weighted with an integral value of a bridging fault resistance value distribution in a detection resistance area according to the test pattern based on the detection limit resistance value and the wiring length using the fault detection information and bridging fault occurrence rate information.

9. The method according to claim 8, wherein the detection limit resistance value is calculated with respect to a voltage corresponding to a base and peaks or a voltage corresponding to a mean value of a logical threshold distribution of a cell to which the bridging point is connected.

10. The method according to claim 8, wherein the bridging fault voltage information is created on only a cell included in a bridging fault detection target circuit.

11. The method according to claim 8, wherein grouping is performed based on a combination of inputs of the cell and the bridging fault voltage information including a frequency of input indicating the number of combinations of each group is created.

12. The method according to claim 8, wherein an input voltage of an arbitrary input of each cell is changed by a predetermined unit and the input voltage when an output logical value changes is calculated as the logical threshold.

13. The method according to claim 12, wherein if a first input voltage at which the output logical value changes when an input logical value is changed from 1 to 0 is different from a second input voltage at which the output logical value changes when the input logical value is changed from 0 to 1, a mean value of the first input voltage and the second input voltage is calculated as the logical threshold.

14. An apparatus for creating a test pattern and calculating a fault coverage, and bridge fault residual ratio or simply total adjacent wiring length of undetected bridge faults, comprising:
a bridging fault voltage calculation section that creates bridging fault voltage information indicating a relationship between logical values of input signals of a plurality of cells and voltages of bridging points assumed on the wires derived from output terminals of the plurality of cells and including supply current value information when a cell that drives one of two output terminals making up the bridging comprises one logical gate and the outputs of the cell are connected to an input of the same cell and when the outputs of the cell are not connected to the input of the same cell respectively;
a logical threshold calculation section that creates logical threshold information by calculating logical thresholds of input terminals of the plurality of cells;
a bridging fault information extraction section that extracts from layout information of a semiconductor integrated circuit bridging fault information including signal information on an adjacent wire pair whose inter-wire distance is within a predetermined short distance range where bridge faults occur with a probability, a wiring length of the adjacent wire pair, information on an input terminal of a drive cell that drives the adjacent wire pair and information on an input terminal of a reception cell to which a signal propagating to the adjacent wire pair is inputted;
a searching section that traces a signal inputted to the drive cell back to an input side of the semiconductor integrated circuit or traces an output signal of the drive cell to an output side of the semiconductor integrated circuit, searches whether or not wires of the adjacent wire pair are connected and detects, when the wires are connected and a feedback bridging fault is formed, whether the number of signal inversions between the connected points and the drive cell is an even number or odd number and creates search result information;
a bridging fault list creation section that creates a bridging fault list including a bridging fault type determined by a relationship between a voltage of the bridging point and logical threshold of the input terminal of the reception cell and a special fault accompanying a feedback bridging fault using the bridging fault information, the search result information, the logical threshold information and the bridging fault voltage information;

a test pattern creation section that creates a test pattern for detecting bridging faults in the adjacent wire pair using the bridging fault list, judges whether the bridging faults included in the bridging fault list can be detected according to the test pattern and creates fault detection information; and a fault coverage calculation section that calculates a bridging fault coverage and bridging fault residual ratio of the test pattern weighted with the wiring length and bridging fault occurrence rate using the fault detection information and bridging fault occurrence rate information.

15. The apparatus according to claim 14, wherein the logical threshold calculation section changes an input voltage of an arbitrary input of each cell by a predetermined unit and calculates the input voltage when an output logical value changes as the logical threshold.

16. The apparatus according to claim 14, further comprising a storage that has a cell library which stores circuit descriptions for a circuit simulation of the cell and an operation model for a circuit simulation of elements used in the circuit descriptions, wherein the bridging fault voltage calculation section reads the circuit descriptions for a circuit simulation and the operation model for a circuit simulation from the cell library, creates a net list for a circuit simulation where outputs of two arbitrary cells are short-circuited, executes a circuit simulation and extracts a voltage of the bridging point from the execution result.

17. The apparatus according to claim 14, wherein the searching section ends a search when formation of a feedback bridging fault is detected through the search of one signal of the adjacent wire pair or searches the other signal when formation of a feedback bridging fault is not detected.

18. The apparatus according to claim 14, wherein the searching section determines whether to perform the search by tracing back to an input side of the semiconductor integrated circuit or tracing to an output side based on the number of logical stages from the input of the semiconductor integrated circuit of the adjacent wire pair.

19. The apparatus according to claim 14, further comprising a storage device having:
- a bridging fault voltage library that stores the bridging fault voltage information;
- a logical threshold library that stores the logical threshold information;
- a layout information area that stores the layout information;
- an extraction condition area that stores information on the predetermined short distance where bridge faults occur with a probability;
- a bridging fault information area that stores the bridging fault information;
- a bridging fault occurrence information area that stores the bridging fault occurrence rate information;
- a search result information area that stores the search result information;
- a bridging fault list area that stores the bridging fault list;
- a fault detection information area that stores the fault detection information; and
- a weighted fault coverage area that stores the bridging fault coverage.

20. The apparatus according to claim 19, wherein the fault coverage calculation section creates an undetected library by sorting faults that cannot be detected by the test pattern in descending order of weights and stores the undetected library in the weighted fault coverage area.

* * * * *